United States Patent
Han et al.

(10) Patent No.: US 11,701,651 B2
(45) Date of Patent: Jul. 18, 2023

(54) MICROFLUIDIC DEVICE CAPABLE OF REMOVING MICROBUBBLES IN CHANNEL BY USING POROUS THIN FILM, SAMPLE INJECTION DEVICE FOR PREVENTING INFLOW OF BUBBLES, AND METHOD FOR BONDING PANEL OF MICROFLUIDIC ELEMENT BY USING MOLD-RELEASING FILM

(71) Applicant: INJE UNIVERSITY INDUSTRY-ACADEMIC COOPERATION FOUNDATION, Gimhae-si (KR)

(72) Inventors: Ki-Ho Han, Busan (KR); Hyung-Seok Cho, Busan (KR)

(73) Assignee: INJE UNIVERSITY INDUSTRY-ACADEMIC COOPERATION FOUNDATION, Gimhae-si (KR)

( * ) Notice: Subject to any disclaimer, the term of this patent is extended or adjusted under 35 U.S.C. 154(b) by 320 days.

(21) Appl. No.: 16/647,157

(22) PCT Filed: Oct. 31, 2018

(86) PCT No.: PCT/KR2018/013096
§ 371 (c)(1),
(2) Date: Mar. 13, 2020

(87) PCT Pub. No.: WO2019/107763
PCT Pub. Date: Jun. 6, 2019

(65) Prior Publication Data
US 2020/0269237 A1  Aug. 27, 2020

(30) Foreign Application Priority Data

Nov. 28, 2017  (KR) .................. 10-2017-0160376
Dec. 13, 2017  (KR) .................. 10-2017-0171352
Dec. 14, 2017  (KR) .................. 10-2017-0172265

(51) Int. Cl.
*B01L 3/00* (2006.01)
*G01N 1/40* (2006.01)

(52) U.S. Cl.
CPC ... *B01L 3/502707* (2013.01); *B01L 3/502753* (2013.01); *B01L 2200/0684* (2013.01);
(Continued)

(58) Field of Classification Search
None
See application file for complete search history.

(56) References Cited

U.S. PATENT DOCUMENTS

2004/0202994 A1* 10/2004 Timperman ..... G01N 27/44791
                                                        435/288.5
2007/0125434 A1    6/2007 Nakao
(Continued)

FOREIGN PATENT DOCUMENTS

CN    205517817 U  *  8/2016  .............. B01L 3/00
JP    2005249540 A  *  9/2005  .............. G01N 35/08
(Continued)

OTHER PUBLICATIONS

Translation of JP 2005249540A. (Year: 2005).*
(Continued)

*Primary Examiner* — Lore R Jarrett
(74) *Attorney, Agent, or Firm* — Sughrue Mion, PLLC

(57) ABSTRACT

Provided is a microfluidic device capable of removing microbubbles in a channel by using a porous thin film, the microfluidic device comprising: an upper panel comprising a microfluidic channel through which a fluid passes; a porous thin film attached to the bottom surface of the microfluidic channel so as to remove microbubbles included in the fluid that passes through the microfluidic channel; a lower panel contacting the bottom surface of the porous thin film and the upper panel, a path being provided in the lower panel so as to discharge microbubbles, which pass through the porous thin film, to the outside; and a vacuum-suctioning means for vacuum-suctioning the upper panel and the lower panel such that the microfluidic channel, to which the porous thin film is attached, is attached to the lower panel in a vacuum state.

13 Claims, 16 Drawing Sheets

(52) U.S. Cl.
CPC ............... *B01L 2300/0816* (2013.01); *B01L 2300/0887* (2013.01); *G01N 2001/4016* (2013.01)

(56) References Cited

U.S. PATENT DOCUMENTS

| | | | | |
|---|---|---|---|---|
| 2008/0118790 | A1* | 5/2008 | Kim | F04B 19/006 429/513 |
| 2011/0226686 | A1* | 9/2011 | Maurer | B01D 63/02 210/206 |
| 2015/0209783 | A1* | 7/2015 | Ingber | B01D 71/36 96/6 |
| 2020/0298232 | A1* | 9/2020 | Madadi | B01L 3/502746 |
| 2021/0002602 | A1* | 1/2021 | Ludlam | C12M 29/00 |

FOREIGN PATENT DOCUMENTS

| | | |
|---|---|---|
| JP | 3918040 A | 5/2007 |
| JP | 2015-199187 A | 11/2015 |
| KR | 10-2006-0129301 A | 12/2006 |
| KR | 10-2017-0022483 A | 3/2017 |

OTHER PUBLICATIONS

Translation of CN 205517817U. (Year: 2016).*
Hamed Gholami Derami et al., "Experimental and Computational Study of Gas Bubble Removal in a Microfluidic System Using Nanofibrous Membranes", Microsystem Technologies, Jun. 2016, pp. 2685-2698, vol. 23, Issue 7.
International Search Report for PCT/KR2018/013096 dated Feb. 20, 2019 [PCT/ISA/210].

* cited by examiner (a)

(b)

(a)

(b)

MICROFLUIDIC DEVICE CAPABLE OF REMOVING MICROBUBBLES IN CHANNEL BY USING POROUS THIN FILM, SAMPLE INJECTION DEVICE FOR PREVENTING INFLOW OF BUBBLES, AND METHOD FOR BONDING PANEL OF MICROFLUIDIC ELEMENT BY USING MOLD-RELEASING FILM

CROSS REFERENCE TO RELATED APPLICATIONS

This application is a National Stage of International Application No. PCT/KR2018/013096 filed Oct. 31, 2018, claiming priority based on Korean Patent Application No. 10-2017-0160376 filed Nov. 28, 2017, Korean Patent Application No. 10-2017-0171352 filed Dec. 13, 2017 and Korean Patent Application No. 10-2017-0172265 filed Dec. 14, 2017, the entire contents of which are incorporated herein by reference.

TECHNICAL FIELD

The present invention relates to a microfluidic device capable of removing microbubbles in a channel using a porous thin film, and more particularly, to a microfluidic device capable of removing bubbles generated in fluid channels of microfluidic technology-based devices for sensors, separation, measurement, cell culturing, and analysis to prevent any interference with the flow of fluid in the channels or prevents the bubbles from occupying the volume that is to be occupied by the fluid, thereby substantially improving the efficiency of specific functions such as analysis, separation, and measurement.

Further, the present invention relates to a sample injection device for preventing inflow of bubbles, and more particularly, to a sample injection device for preventing inflow of bubbles, which is capable of removing bubbles generated in fluid channels of microfluidic technology-based devices for sensors, separation, measurement, cell culturing, and analysis to prevent any interference with the flow of fluid in the channels or prevents the bubbles from occupying the volume that is to be occupied by the fluid, thereby substantially improving the efficiency of specific functions such as blood analysis, cell separation, and measurement.

Further, the present invention relates to a method for bonding panel of microfluidic element by using a releasing film, and more particularly, to a method for bonding panel of microfluidic element by using a releasing film, which is capable of providing a strong adhesive force by attaching a panel and a release film by a simple process without solvent in the process of manufacturing microfluidic technology-based devices for sensors, separation, measurement, cell culturing, and analysis.

BACKGROUND ART

Microfluidic technology-based devices for sensors, cell separation, detection, measurement, cell culturing, and analysis inevitably have problems in that unnecessary microbubbles are generated inside the channel. These microbubbles can clog the inside of the channel and interfere with the flow of the fluid or occupy a volume occupied by the fluid, thereby degrading the efficiency of specific functions such as analysis, separation, and measurement.

In order to avoid these issues, conventional methods have been used in which materials such as ethanol and methanol are injected into the channel before the device is operated, and then operators precisely process the injectable sample and the buffer solution by hand so that the microbubbles do not occur as much as possible and inject the sample and buffer solution into the device.

However, this requires a cumbersome process of treating a reagent for causing the microfluidic channel to have hydrophilicity therein, and even a sophisticated process cannot remove the ultra-fine bubbles present in the sample and the buffer solution. As a result, they still have the problem of entering bubbles into the channel according to the flow of fluid, which has a fatal effect on device operation.

Further, in the past, a method is used to remove bubbles, in which the sample is treated by bubble-removing equipment in the fluid before the sample is injected, and then the sample is injected into the device. However, the method has the disadvantage of requiring additional equipment to remove microbubbles.

Therefore, there is a need to require the microfluidic device which is operated for a certain purpose as well as the removal of bubbles, in which itself removes the bubbles in the fluid without the need for additional equipment while removing the ultra-fine bubbles present in the sample and the buffer solution. Accordingly, the present applicant has completed the present invention as a result of repeated studies.

Recently, studies on experimental and analytical techniques using microfluidic elements (microfluidics chip) including microfluidic channels have been actively conducted in the field of biotechnology.

In particular, separation techniques to analyze only the desired components of the sample or to purify only certain components from the mixture are very important in the pretreatment of the sample. In particular, in the lab-on-a-chip, which is a concept to integrate a small flow path, a mixer, a pump, and a valve into a single chip to process a small amount of samples at high rate and efficiency, a process of preparing sample such as purification and separation is a critical skill that must be preceded by the sub-analysis process.

Further, cell-based diagnostics, which are important for biological or medical analysis, consist of blood analysis, cell research, microbial analysis, and tissue transplantation. One area of great interest in the biotechnology field is blood research. There is a field of interpretation and measurement of blood flow in blood vessels in the human body, and a lot of research is being conducted on the development of a test method using blood separation and blood analysis.

Blood is mainly composed of red blood cells, white blood cells, blood platelet), and blood plasma, and in many cases, cells such as red blood cells or white blood cells can be separated, cultured and tested.

However, conventional microfluidic technology-based devices for sensors, separation, measurement, cell culturing, and analysis inevitably have problems in that unnecessary microbubbles (fine bubbles) are generated inside the channel. These microbubbles can clog the inside of the channel and interfere with the flow of the fluid or occupy a volume occupied by the fluid, thereby degrading the efficiency of specific functions such as analysis, separation, and measurement.

In order to avoid these issues, conventional methods have been used in which materials such as ethanol and methanol are injected into the channel before the device is operated, and then operators precisely process the injectable sample and the buffer solution by hand so that the microbubbles do not occur as much as possible and inject the sample and buffer solution into the device.

However, this requires a cumbersome process of treating a reagent for causing the microfluidic channel to have hydrophilicity therein, and even a sophisticated process cannot remove the ultra-fine bubbles present in the sample and the buffer solution. As a result, they still have the problem of entering bubbles into the channel according to the flow of fluid, which has a fatal effect on device operation.

Further, in the past, a method is used to remove bubbles, in which the sample is treated by bubble-removing equipment in the fluid before the sample is injected, and then the sample is injected into the device. However, the method has the disadvantage of requiring additional equipment to remove microbubbles.

Therefore, there is a need to require the microfluidic device which is operated for a certain purpose as well as the removal of bubbles, in which itself removes the bubbles in the fluid without the need for additional equipment while removing the ultra-fine bubbles present in the sample and the buffer solution. Accordingly, the present applicant has completed the present invention as a result of repeated studies.

Meanwhile, the microfluidic element is generally made of a polymer material, and it is very difficult to form a microfluidic channel on a polymer substrate.

Conventionally, soft lithography processes have been used to form a microfluidic channel on a polymer substrate. However, soft lithography processes have disadvantages of using only a limited kind of polymer material and being complicated.

Further, the solvent bonding method has been used to fabricate microfluidic channels on plasma-treated substrates. That is, after positioning and pressing the substrate, a solvent, such as acetone, is injected at various points around the channel wall by a pipette, and then the injected acetone flows along the edge portion and slightly penetrates into the interface to melt and bond. This is a method of joining them using a solvent. Thus, there are disadvantages that the interface has to be slightly melted, which is not suitable for forming a very small sized fluid channel.

Alternatively, the silicon substrate is etched to form a microfluidic channel having a predetermined cross-sectional shape in the form of an intaglio form, the polymer is applied thereon and then cured to form a polymer mold. Then, the polymer mold is separated from the silicon substrate and is pressed with another polymer layer, followed by transcription to produce microfluidic channels.

This method was also difficult to manufacture a microfluidic channel because the manufacturing process is very cumbersome and complicated, and the present applicants have recognized the problem and repeatedly studied to solve the problem, thereby completing the present invention.

DISCLOSURE

Technical Problem

The present invention has been made to solve the above problems and is to provide a microfluidic device capable of removing microbubbles in a channel by removing microbubbles generated in fluid channels of microfluidic technology-based devices for sensors, separation, measurement, cell culturing, and analysis to prevent any interference with the flow of fluid in the channels or prevents the microbubbles from occupying the volume that is to be occupied by the fluid, thereby substantially improving the efficiency of specific functions such as analysis, separation, and measurement.

Further, the present invention is to provide a microfluidic device capable of removing microbubbles in the channel without a separate device for removing bubbles because the microfluidic device itself remove bubbles in the fluid to operate the device and remove bubbles in the fluid at the same time.

The present invention has been made to solve the above problems and is to provide a sample injection device for preventing inflow of bubbles by removing microbubbles generated in fluid channels of microfluidic technology-based devices for sensors, separation, measurement, cell culturing, and analysis to prevent any interference with the flow of fluid in the channels or prevents the microbubbles from occupying the volume that is to be occupied by the fluid, thereby substantially improving the efficiency of specific functions such as analysis, separation, and measurement.

Further, the present invention is to provide a sample injection device for preventing the inflow of bubbles without a separate device for removing bubbles because the device itself remove bubbles in the fluid to operate the device and remove bubbles in the fluid at the same time.

Further, the present invention has been made to solve the above problems and is to provide a method of bonding panel of microfluidic element using a release film in which the method is capable of attaching the release film and panel by a simple process without solvent in the process of manufacturing microfluidic technology-based devices for sensors, separation, measurement, cell culturing, and analysis.

Further, the present invention is to provide a method of bonding panel of the microfluidic element, in which the method can form a very robust and stable microfluidic channel due to the production of strong adhesion between the panel and the release film in spite of a simple process.

Moreover, the present invention is to provide a method of bonding panel of microfluidic element using a release film that can be very usefully used in the art because microfluidic channels can be formed by a simple process and strong adhesion, thus they can be applied to various processes in manufacturing microfluidic technology-based devices for sensors, separation, measurement, cell culturing, and analysis.

Technical Solution

In order to achieve the above object, the present invention provides microfluidic device comprising an upper panel including a microfluidic channel through which a fluid passes, a porous thin film attached to the bottom surface of the microfluidic channel so as to remove microbubbles included in the fluid that passes through the microfluidic channel, a lower panel contacting the bottom surface of the porous thin film and the upper panel and having a path for discharging microbubbles, which pass through the porous thin film, to the outside and a vacuum-suctioning means for vacuum-suctioning the upper panel and the lower panel such that the microfluidic channel, to which the porous thin film is attached, is attached to the lower panel in a vacuum state.

Further, in order to achieve the above object, the present invention provides a sample injection device for preventing inflow of bubbles, the device comprising a sample inlet into which a sample is injected, a upper panel formed with a microfluidic channel including a sample injection channel connecting a main channel to the sample inlet, a bubble inflow-preventing means formed in any portion of the microfluidic channel to be capable of holding bubbles included in the fluid, a porous thin film attached to a bottom surface of the microfluidic channel to remove bubbles included in the fluid passing through the microfluidic channel, a lower panel contacting the upper panel and a bottom surface of the porous thin film and having a path for discharging bubbles, which pass through the porous thin film, to the outside and a vacuum-suctioning means for vacuum-suctioning the upper panel and the lower panel such that the microfluidic channel, to which the porous thin film is attached, is attached to the lower panel in a vacuum state.

Further, in order to achieve the above object, the present invention provides a method for bonding panel of microfluidic element by using a releasing film, the method comprising a) preparing a panel made of a material selected from the group consisting of polydimethylsiloxane (PDMS), silicone resin, or mixtures thereof, b) preparing a release film coated with silicon nanoparticles on one or both surfaces thereof, c) plasma-treating the surfaces of the panel and the release film and d) bonding the panel and the release film by performing heat treatment at a predetermined temperature range in a state in which the plasma-treated panel and the release film are attached to each other.

Advantageous Effects

Accordingly, the present invention is advantageous in that, by removing bubbles generated in fluid channels of microfluidic technology-based devices for sensors, separation, measurement, cell culturing, and analysis, the same prevents any interference with the flow of fluid in the channels or prevents the microbubbles from occupying the volume that is to be occupied by the fluid, thereby substantially improving the efficiency of specific functions such as analysis, separation, and measurement.

Further, the present invention is advantageous in terms of cost compared to the prior art in that, by removing the bubbles in the fluid by the microfluidic device itself, it is possible to remove the bubbles in the fluid and drive the device at the same time, which eliminates the need for a separate device for removing bubbles.

Further, the present invention is advantageous in that it can be used universally in various technologies because the structure to remove the bubbles in the fluid is easy to manufacture and mass production.

Further, the present invention is advantageous in that, by removing microbubbles generated in fluid channels of microfluidic technology-based devices for sensors, separation, measurement, cell culturing, and analysis, the same prevents any interference with the flow of fluid in the channels or prevents the microbubbles from occupying the volume that is to be occupied by the fluid, thereby substantially improving the efficiency of functions associated with biotechnology such as blood analysis, cell research, and microbial analysis.

Further, the present invention is advantageous in terms of cost compared to the prior art in that, by removing the bubbles in the fluid by the device itself, it is possible to remove the bubbles in the fluid and drive the device at the same time, which eliminates the need for a separate device for removing bubbles.

Further, the present invention is advantageous in that it can be used universally in various technologies because the structure to remove the bubbles in the fluid is easy to manufacture and mass production.

Further, the present invention is advantageous in that the panel and the release film can be attached by a simple process without solvent in the process of manufacturing microfluidic technology-based devices for sensors, separation, measurement, cell culturing, and analysis.

Further, the present invention is advantageous in that it can form a very robust and stable microfluidic channel due to the production of strong adhesion between the panel and the release film in spite of a simple process.

Moreover, the present invention is advantageous in that it can be very usefully used in the art because microfluidic channels can be formed by a simple process and strong adhesion, thus they can be applied to various processes in manufacturing microfluidic technology-based devices for sensors, separation, measurement, cell culturing, and analysis.

MODES OF THE INVENTION

Hereinafter, the preferred embodiments of the present invention will be described in detail with reference to the accompanying drawings. However, the present invention is not limited to the embodiments disclosed below, but will be implemented in various different forms. The embodiments are only intended to complete the disclosure of the present invention and to fully inform the person skilled in the art the scope of the present invention.

Figure 1:
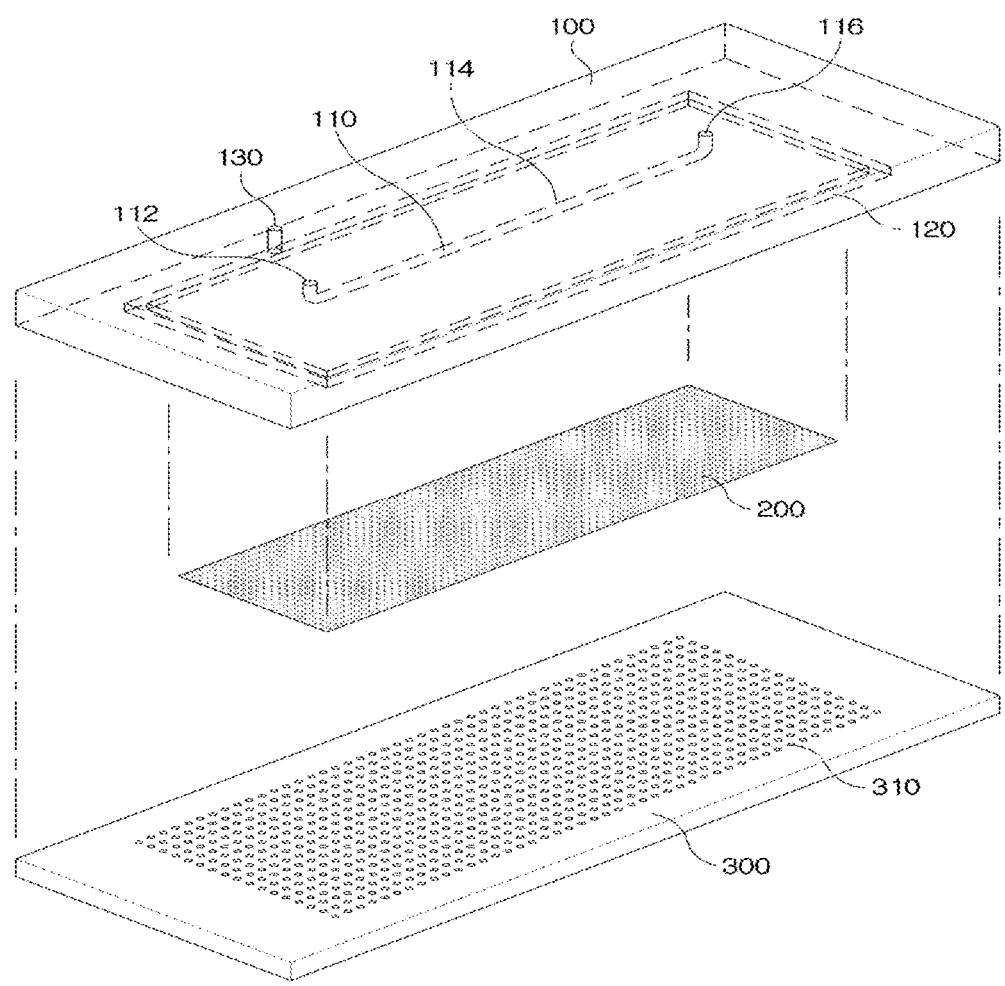
FIG. 1 is an exploded perspective view showing an embodiment of a microfluidic device capable of removing microbubbles in a channel of the present invention.
Figure 2:
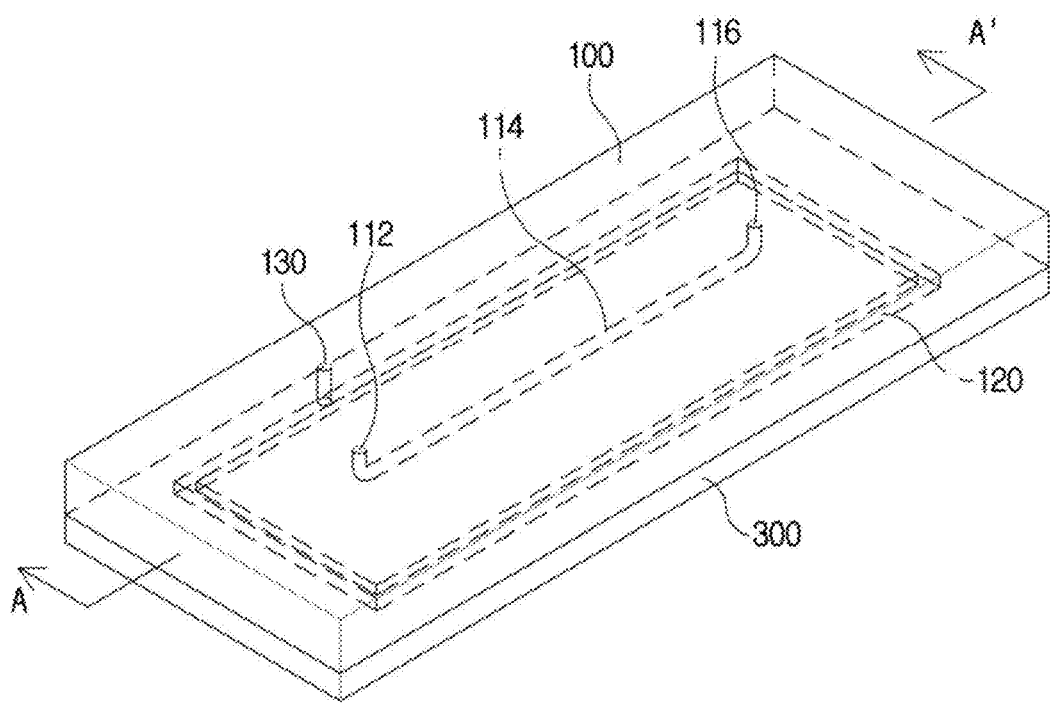
FIG. 2 is a perspective view of the combination of the embodiment shown in FIG. 1.
Figure 3:
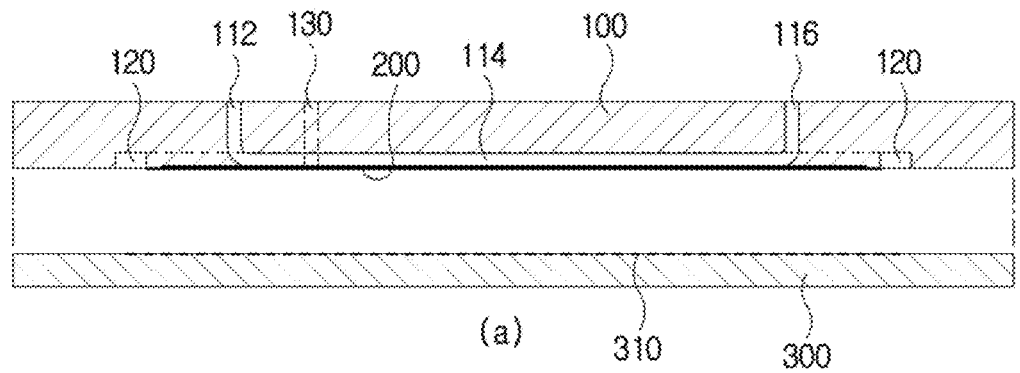
FIG. 3 is a cross-sectional view showing a cross-section along A-A' in FIG. 2.
Figure 3:
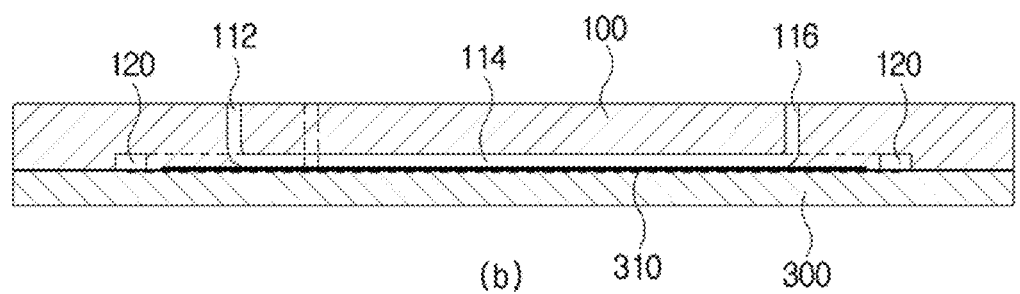

FIG. 1 is an exploded perspective view showing an embodiment of a microfluidic device capable of removing microbubbles in a channel of the present invention, FIG. 2 is a perspective view of the combination of the embodiment shown in FIG. 1, and FIG. 3 is a cross-sectional view showing a cross-section along A-A' in FIG. 2.

As shown in FIGS., the microfluidic device of the present invention includes an upper panel 100, a porous thin film 200, and a lower panel 300.

The upper panel 100 includes a microfluidic channel 110 through which fluid passes and may be made of a material such as silicone rubber (PDMS) or plastic.

The microfluidic channel 110 is a channel through which a fluid serving as a sample passes and includes a fluid inlet 112 for injecting a fluid, a flow path 114 through which the fluid introduced from the fluid inlet 112 flows, and a fluid outlet 116 through which the fluid flowing through the flow path 114 is discharged.

Here, the flow path 114 is formed with a groove shape at a predetermined depth on the bottom surface of the upper panel 100. That is, the flow path 114 is formed with a groove having a predetermined depth on the bottom surface of the upper panel 100, and the flow path 114 through which the fluid flows is formed by attaching the porous thin film 200 to the bottom surface of the groove.

In one embodiment of the present invention, the fluid inlet 112 and the fluid outlet 116 are formed to communicate with the top surface of the upper panel 100, and the lower ends of the fluid inlet 112 and the fluid outlet 116 are connected to the flow path 114 so as to allow the fluid to flow in a shape of '⌒'. However, this is only one embodiment of the present invention, which is not limited to the location where the fluid inlet 112 and the fluid outlet 116 is formed.

Namely, in some cases, the fluid inlet 112 and the fluid outlet 116 may be formed to communicate with the side surface of the upper panel 100, and the flow path 114 may also be formed in various shapes.

In other words, in the microfluidic device of the present invention, the flow path 114 of the microfluidic channel 110 is formed with a groove having a predetermined depth on the bottom surface of the upper panel 100, and the porous thin film 200 is attached to the bottom surface of the groove so that when the fluid flows through the microfluidic channel 110, microbubbles in the fluid come out through the porous thin film 200. The shape of the flow path 114 and the location at which the fluid inlet 112 and the fluid outlet 116 are formed may be variously applied.

Meanwhile, the porous thin film 200 is attached to the bottom surface of the microfluidic channel 110 to remove microbubbles contained in the fluid passing through the microfluidic channel 110, and the porous thin film 200 has a hydrophobic property so that only the microbubbles contained in the fluid pass through the porous thin film 200 and come out to the lower panel 300 while the porous thin film 200 blocks fluid flowing through the microfluidic channel 110.

In other words, when the fluid flows over the porous thin film 200 while flowing through the microfluidic channel 110, since the thin film 200 is hydrophobic, the fluid flowing through the microfluidic channel 110 does not pass through pores of the porous thin film 200 and flows intact without coming out. On the other hand, the microbubbles in the fluid come out through the pores of the hydrophobic porous thin film 200.

In the present invention, the porous thin film 200 may be made of a hydrophobic material or may have hydrophobicity by treating a hydrophobic material on the surface of the porous thin film 200.

The porous thin film 200 may be applicable to all various materials such as glass, polymer, and paper, and may include, for example, at least one selected from the group consisting of polydimethylsiloxane (PDMS), polyethylene terephthalate (PET), polyimide (PI), polypropylene (PP), poly(methyl methacrylate) (PMMA), polycaprolactone, polystyrene, propylene carbonate, ethylene carbonate, dimethyl carbonate, diethyl carbonate, polymer plastic, glass, paper and ceramic.

The porous thin film 200 is preferably a film in which nano-sized pores are formed in a polymer (PET, PI, PP, PMMA, etc.).

The microbubbles coming out through the porous thin film 200 are in contact with the surface of the lower panel 300.

The lower panel 300 is installed in contact with the bottom surfaces of the upper panel 100 and the porous thin film 200, and must be attached in a vacuum state to the microfluidic channel 110 to which the porous thin film 200 is attached. The lower panel 300 must be provided with a path for discharging the microbubbles coming out through the porous thin film 200 to the outside.

In order to attach the microfluidic channel 110 to which the porous thin film 200 is attached and the lower panel 300 in a vacuum state, the present invention includes a vacuum-suctioning means for applying a vacuum.

Herein, the vacuum-suctioning means may include a vacuum groove 120 formed on the bottom surface of the upper panel 100 and a vacuum-suctioning hole 130 communicating with the vacuum groove 120 to apply a vacuum to the vacuum groove 120 so that the microfluidic channel 110, to which the porous thin film 200 is attached, is attached to the lower panel 300 in a vacuum state.

The vacuum groove 120 is formed to surround the periphery of the microfluidic channel 110 and the porous thin film 200. In other words, as shown in FIG. 1, the vacuum groove 120 is preferably formed in a quadrangular shape so as to include the region in which both the microfluidic channel 110 and the porous thin film 200 are formed.

Both ends of the vacuum-suctioning hole 130 are formed to communicate with the top or side surfaces of the upper panel 100 and the vacuum groove 120 and are connected to an external device, thereby applying a vacuum so as to completely remove the air layer between the lower panel 300 and the upper panel 100, resulting in the vacuum-suction between the lower panel 300 and the upper panel 100.

In the present invention, the vacuum-suctioning hole 130 is formed to communicate with the top surface of the upper panel 100 as shown in FIGS. 1 to 3, but the present invention is not limited thereto. The vacuum-suctioning hole 130 may have a structure in communication with the side of the upper panel 100 to suck the air in the vacuum groove 120 through the vacuum-suctioning hole 130 from the outside.

Due to this structure, the lower panel 300 and the channel 110 may be detachable by the vacuum groove 120. That is, when the vacuum is applied to the vacuum groove 120, the lower panel 300 and the channel 110 are attached by the vacuum, but when the vacuum which is applied to the vacuum groove 120 is released, the gap between the lower panel 300 and the channel 110 is generated, and the lower panel 300 and the channel 110 may be spaced.

In the present invention, the microbubbles coming out through the porous thin film 200 are collected on the lower panel 300, and thus, the lower panel 300 should be provided with a path for discharging the microbubbles to the outside. To this end, in the present invention, the pattern 310 is protruded at regular intervals on the surface of the lower panel 300.

The pattern 310 is formed in the height of several micrometers on the surface of the lower panel 300 so as to generate a space of several micrometers between the porous thin film 200 and the lower panel 300. This space is a path through which the microbubbles passing through the porous thin film 200 may smoothly come out to the outside.

The pattern 310 may be formed integrally on a surface of the lower panel 300 or by attaching a patterned thin film thereon.

The known technique may be applied to the method of integrally forming the patterns 310 on the surface of the lower panel 300, and thus a detailed description thereof will be omitted.

Figure 6:
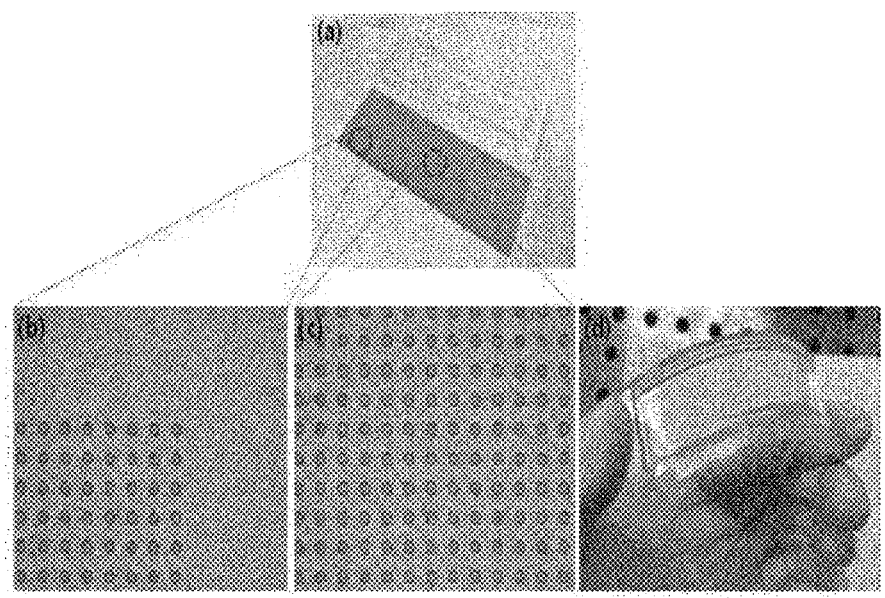
FIG. 6 is a photograph showing an actual sample of the microfluidic device of the present invention.

FIG. 6 is a photograph showing an actual sample of the microfluidic device of the present invention, viewing ((a) of FIG. 6) the microfluidic channel and lower panel developed by the applicant (a circular structure pattern), ((b) of FIG. 6) partially enlarged image of the edge of the lower panel patterning, ((c) of FIG. 6) partially enlarged image of the middle of the lower panel patterning, and ((d) of FIG. 6) appearance showing the porous thin film attached under the microfluidic channel.

In the microfluidic device of the present invention having such a configuration, it can be confirmed that when the fluid and the gas are injected into the microfluidic channel 110 attached to the lower panel 300 at regular intervals, the gas entering the channel disappears and only the fluid flows. The rate at which the microbubble in the fluid comes out may be adjusted according to the thickness of the porous thin film, the height of the pattern of the lower panel, the strength of the vacuum applied to the vacuum groove and the size of the hole formed in the porous thin film.

Figure 4:
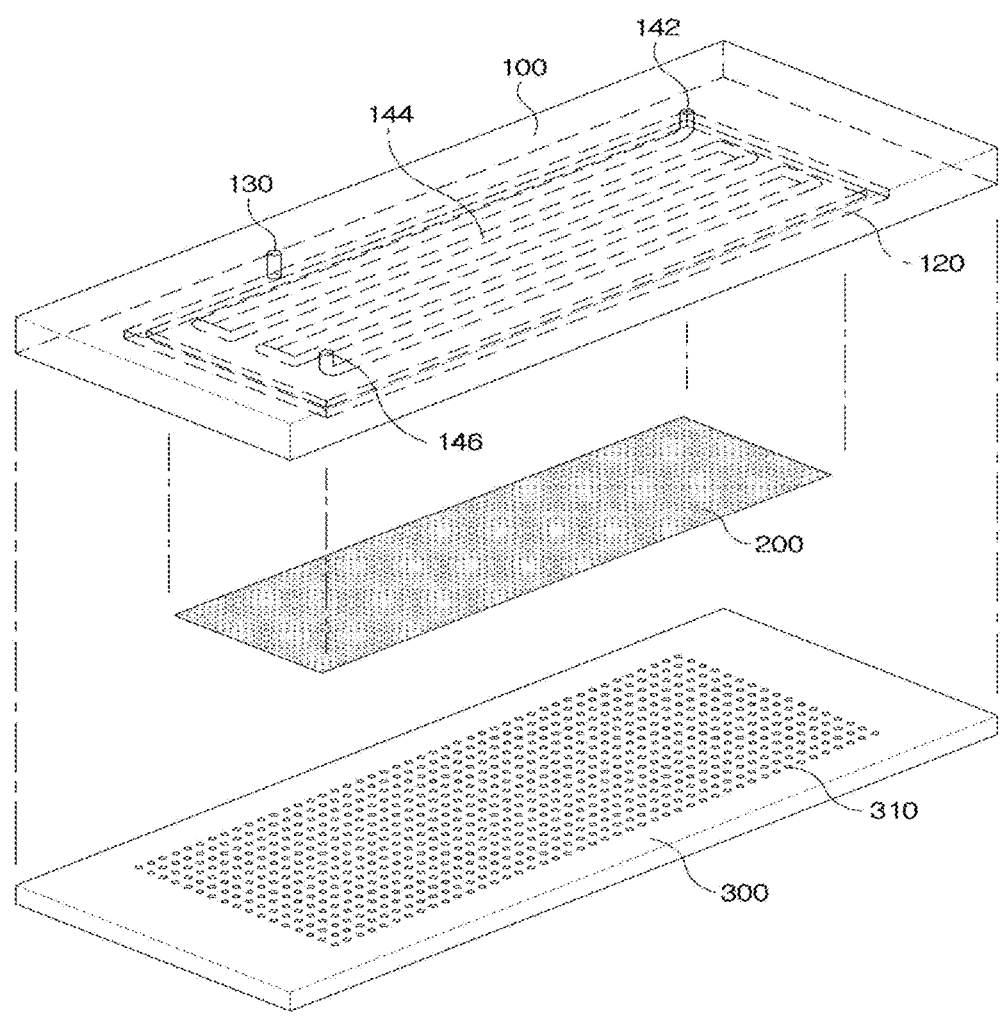
FIG. 4 is an exploded perspective view showing another embodiment of a microfluidic device capable of removing microbubbles in a channel of the present invention.
Figure 5:
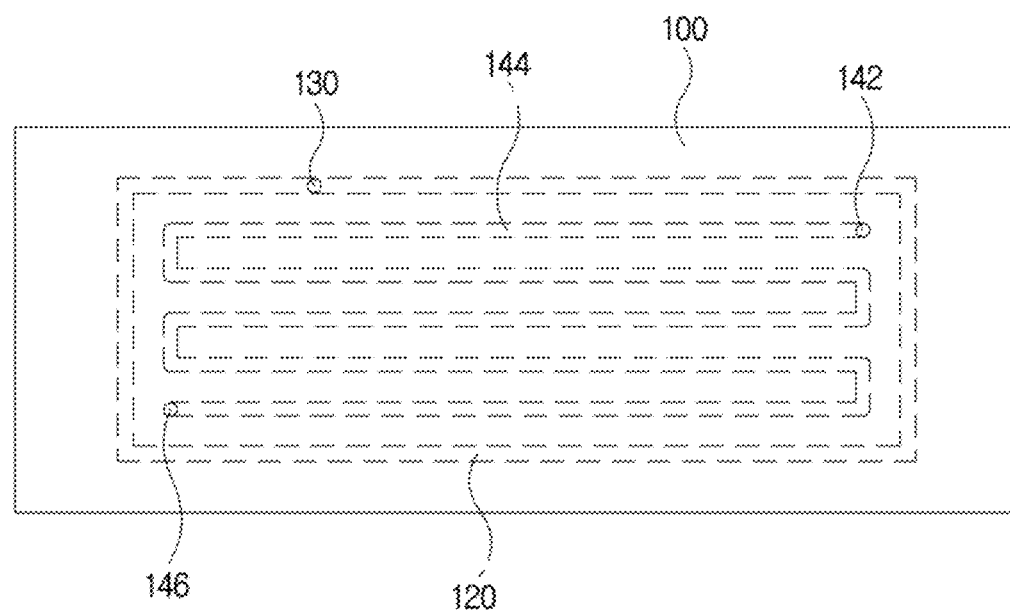
FIG. 5 is a plan view of an upper panel in FIG. 4.

FIG. 4 is an exploded perspective view showing another embodiment of a microfluidic device capable of removing microbubbles in the channel of the present invention, and FIG. 5 is a plan view of the upper panel in FIG. 4.

Another embodiment of the invention shown in FIGS. 4 to 5 includes the upper panel 100, the porous thin film 200, the lower panel 300 and the vacuum-suctioning means, which are the same as those of the above-described embodiment, but the shape of the microfluidic channel formed in the upper panel 100 thereof is formed differently from the channel of the above-described embodiment.

Meanwhile, the microfluidic channel also includes a fluid inlet 142 for injecting a fluid, a flow path 144 through which the fluid introduced from the fluid inlet 142 flows and a fluid outlet 146 through which the fluid flowing through the flow path 144 is discharged, and the flow path 144 is connected between the fluid inlet 142 and the fluid outlet 146 in a zigzag shape so as to has an elongated shape.

Another embodiment of the present invention as described above is to measure that when the vacuum is applied through the vacuum-suctioning means, fluid flowing through the microfluidic channel is moved into the channel and gradually inside the channel over time. Due to the long flow path 144 with a zigzag shape, the state and time at which the fluid passes along the flow path 144 can be measured more accurately.

The flow path 114 is also formed with a groove shape at a predetermined depth on the bottom surface of the upper panel 100. The flow path 114 through which the fluid can flow is formed by attaching the porous thin film 200 to the bottom surface of the groove, thereby forming a structure in which the microbubbles in the fluid may come out through the porous thin film 200.

Figure 7:
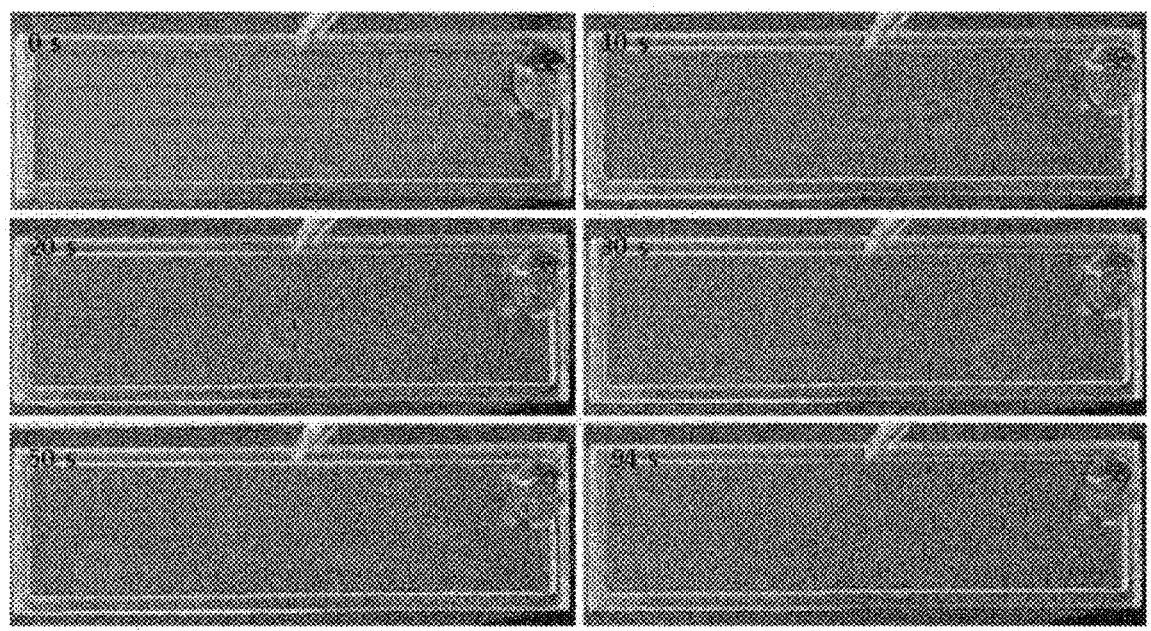
FIG. 7 is a photograph illustrating an experiment of measuring a time at which a fluid in a channel passes through another embodiment of the present invention.
Figure 8:
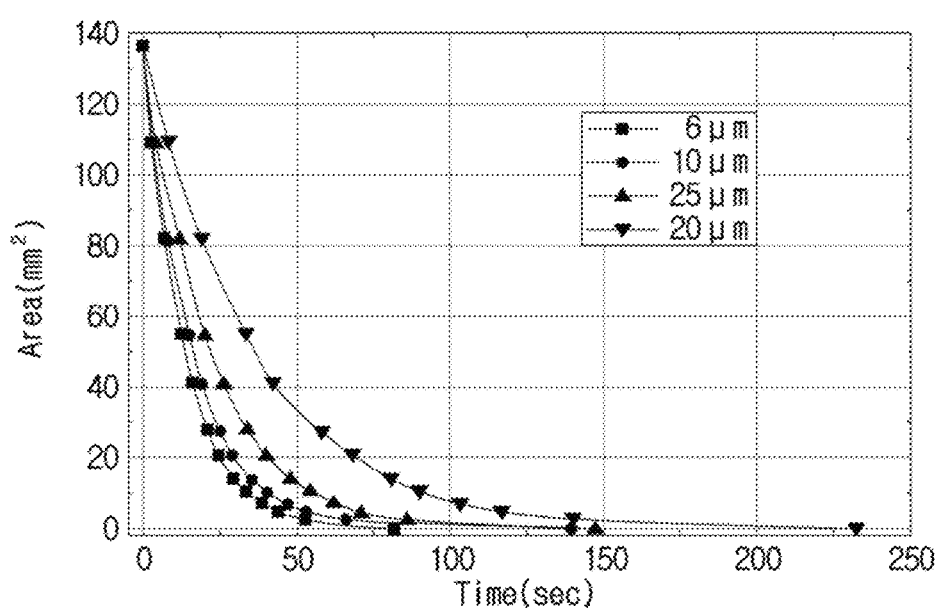
FIG. 8 is a graph showing the rate at which microbubbles disappear according to the thickness of the thin film in another embodiment of the present invention.

FIG. 7 is a photograph illustrating an experiment of measuring a time at which a fluid in a channel passes through another embodiment of the present invention, and FIG. 8 is a graph showing the rate at which microbubbles disappear according to the thickness of the thin film in another embodiment of the present invention.

In order to check whether the fluid passes along the flow path when the vacuum is applied to the microfluidic device of the present invention, as shown in FIG. 7, the present applicants dropped the water into the fluid inlet 142 and applied a vacuum to the vacuum groove 120 through the vacuum-suctioning hole 130. As a result, as the air comes out from inside of the microfluidic channel, water dropped at the channel inlet gradually progresses into the channel. It can be measured that it takes 94 seconds to pass through the flow path 144.

Further, FIG. 8 is a graph showing the rate at which the microbubbles disappear according to the thickness of the thin film. The X-axis represents the time taken for the bubbles to disappear when the fluid proceeds into the channel, and the Y-axis represents the volume of air remaining inside the channel as the fluid proceeds into the channel.

The experiment in FIG. 8 was performed in the same manner as those in FIG. 7. The thickness of the porous thin film under the microfluidic channel was differently applied to 6, 10, 15, and 20 μm, respectively, to measure how quickly the fluid filled in the channel.

As a result, it was confirmed that the thinner the thin film, the faster the fluid fills the inside of the microfluidic channel.

Therefore, in order to quickly remove the microbubbles in the fluid, it is preferable to reduce the thickness of the porous thin film. Further, the rate at which the microbubbles in the fluid come out can be adjusted according to the thickness of the porous thin film, the height of the pattern of the lower panel, the strength of the vacuum applied to the vacuum groove and the size of the hole formed in the porous thin film.

Hereinafter, a sample injection device for preventing the inflow of bubbles, which is another embodiment of the present invention, is described.

Figure 9:
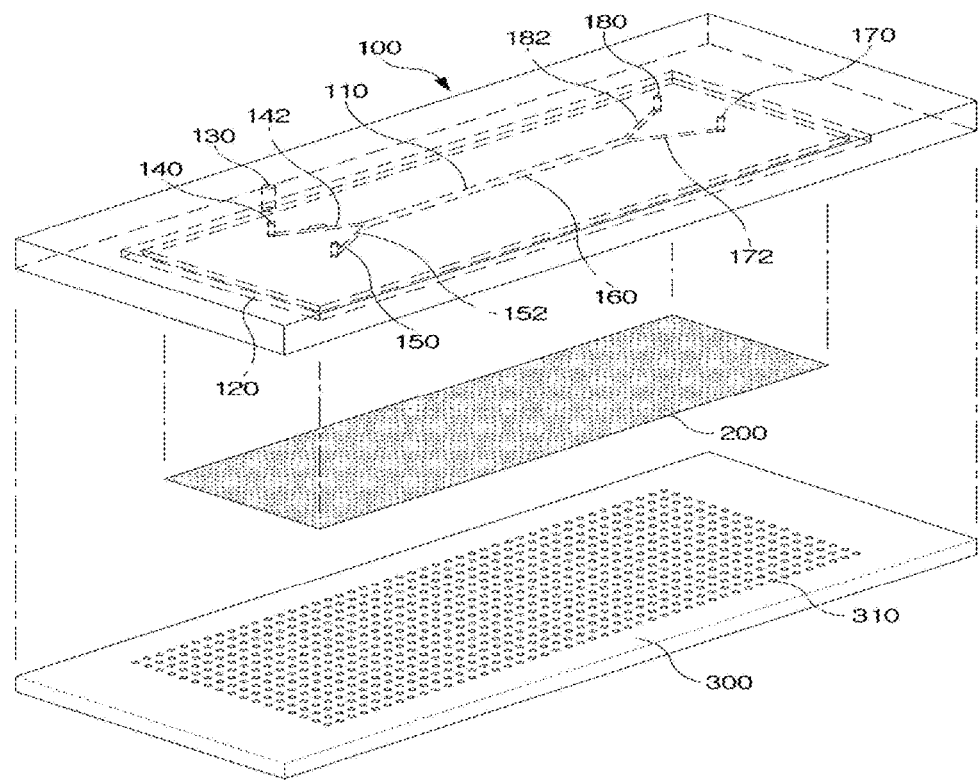
FIG. 9 is an exploded perspective view showing an embodiment of a sample injection device for preventing the inflow of bubbles of the present invention.
Figure 10:
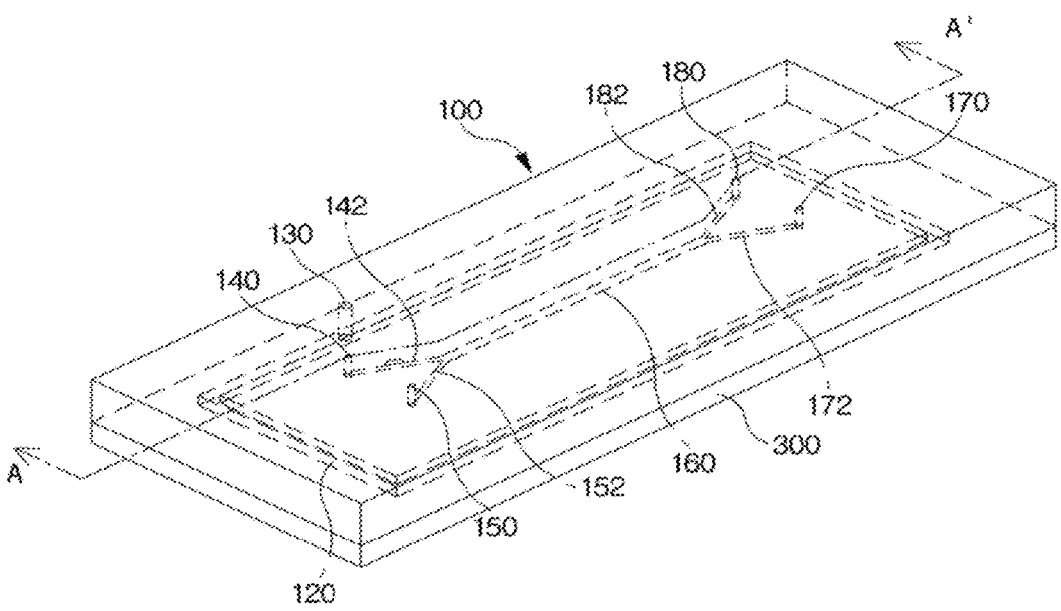
FIG. 10 is a perspective view of the combination of the embodiment shown in FIG. 9.
Figure 11:
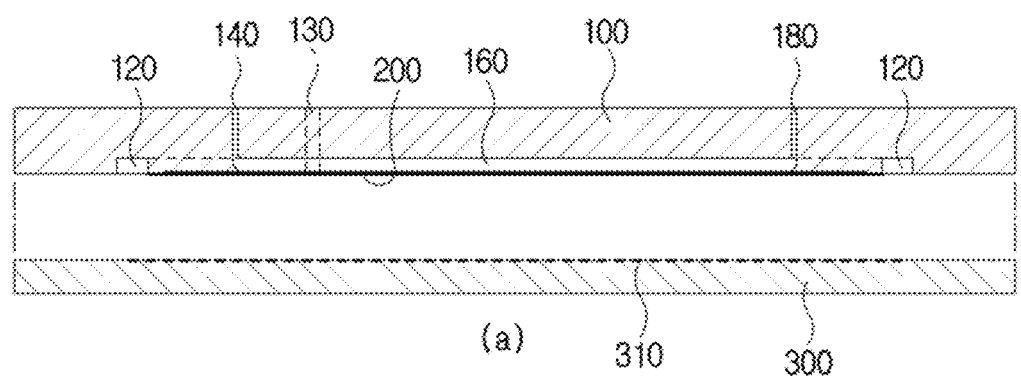
FIG. 11 is a cross-sectional view illustrating a cross-section along A-A' in FIG. 10.
Figure 11:
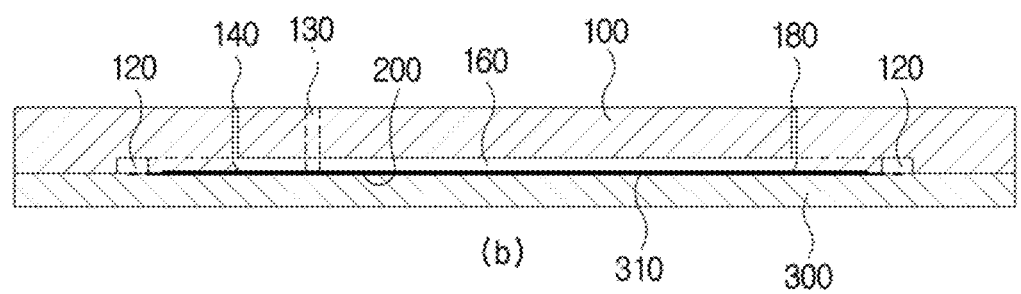

FIG. 9 is an exploded perspective view showing an embodiment of a sample injection device for preventing the inflow of bubbles of the present invention, FIG. 10 is a perspective view of the combination of the embodiment shown in FIG. 9, and FIG. 11 is a cross-sectional view illustrating a cross-section along A-A' in FIG. 10.

As shown in FIGS., the sample injection device of the present invention includes an upper panel 100, a porous thin film 200, and a lower panel 300.

The upper panel 100 includes a microfluidic channel 110 through which fluid passes and may be made of a material such as silicone rubber (PDMS) or plastic.

In the present invention, the microfluidic channel 110 includes a sample inlet 140 into which a sample is injected, buffer solution inlet 150 into which buffer solution is injected, a main channel 160, a first outlet 170 through which desired cells are separated and discharged from the sample and a second outlet 180 through which the remaining solution is discharged. The present invention presents an embodiment of a microfluidic channel used in a separation technique for analyzing only a desired component (cell) in a sample or purifying only a specific component from a mixture to describe the configuration of the present invention, but the technical concept of the present invention is not limited thereto.

That is, the microfluidic channel 110 may include channels in all sample injection devices applied to a microfluidic technology-based device such as a sensor, separation, measurement, cell culturing, and analysis, and the feature of the present invention is to remove bubbles generated in the microfluidic channel, thereby substantially improving the efficiency of specific functions, such as blood analysis, cell separation, and measurement.

In one embodiment, the microfluidic channel 110 is provided with one sample inlet 140 and one buffer solution inlet 150, respectively. The sample injection channel 142 and the buffer solution channel 152 has a form that is connected to the main channel 160 at the point where their rear ends meet so that the sample and the buffer solution flowed through the sample injection inlet 140 and the buffer solution inlet 150, respectively, are introduced into the main channel 160 through the sample injection channel 142 and the buffer solution channel 152, respectively.

In addition, a rear end of the main channel 160 is connected to a first discharge channel 172 and a second discharge channel 182, which are connected to the first outlet 170 and the second outlet 180, respectively, so that the separated cells or the remaining solution, which are separated in a process in which they pass through the main channel 160, are discharged through outlets, respectively.

The microfluidic channel 110 of the present invention has a groove shape formed at a predetermined depth on the lower surface of the upper panel 100. That is, the sample injection channel 142, the buffer solution channel 152, the main channel 160, the first discharge channel 172 and the second discharge channel 182 constituting the microfluidic channel 110 are formed of a groove at a predetermined depth on the bottom surface of the upper panel 100, and the porous thin film 200 is attached to the bottom surface of the groove so as to form a microfluidic channel 110 through which fluid can flow.

Meanwhile, in the present invention, the bubble inflow-preventing means for holding the bubbles included in the fluid to any portion of the microfluidic channel 110 is formed.

The bubble inflow-preventing means includes a pillar 142a formed inside the sample injection channel 142 to hold bubbles so as to prevent the bubbles contained in the sample from introducing into the main channel 160 and bypass channel 144 formed in front of the sample injection channel 142 on which the pillar 142a is formed to bypass the sample so as to introduce the sample into the main channel 160. The detailed description thereof is provided below.

Meanwhile, the porous thin film 200 of the present invention allows only the microbubbles contained in the fluid to pass through the microfluidic channel 110 and come out to the lower panel 300 without passing the fluid flowing through the microfluidic channel 110. As such, by attaching the porous thin film 200 to the bottom surface of the microfluidic channel 110, the microbubbles in the fluid flowing through the microfluidic channel 110 pass through the porous thin film 200 and come out to a side of the bottom panel 300, thereby removing the microbubbles present in the sample and the buffer solution.

To this end, the porous thin film 200 is characterized in that it has a hydrophobicity so that only the microbubbles contained in the fluid passes through the microfluidic channel 110 to come out to the lower panel 300 without passing the fluid flowing through the microfluidic channel 110.

In other words, when the fluid flows over the porous thin film 200 while flowing through the microfluidic channel 110, since the thin film 200 is hydrophobic, the fluid flowing through the microfluidic channel 110 does not pass through pores of the porous thin film 200 and flows intact without coming out. On the other hand, the microbubbles in the fluid come out through the pores of the hydrophobic porous thin film 200.

In the present invention, the porous thin film 200 may be made of a hydrophobic material or may have hydrophobicity by treating a hydrophobic material on the surface of the porous thin film 200.

The porous thin film 200 may be applicable to all various materials such as glass, polymer, and paper, and may include, for example, at least one selected from the group consisting of polydimethylsiloxane (PDMS), polyethylene terephthalate (PET), polyimide (PI), polypropylene (PP), poly(methyl methacrylate) (PMMA), polycaprolactone, polystyrene, propylene carbonate, ethylene carbonate, dimethyl carbonate, diethyl carbonate, polymer plastic, glass, paper and ceramic.

The porous thin film 200 is preferably a film in which nano-sized pores are formed in a polymer (PET, PI, PP, PMMA, etc.).

Figure 12:
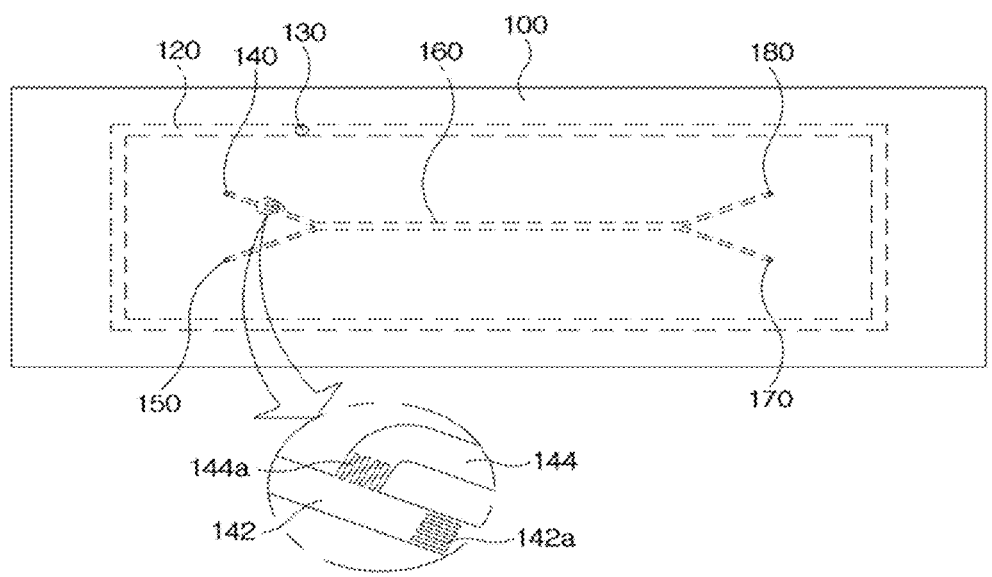
FIG. 12 is a plan view of an upper panel on which a microfluidic channel of the present invention is formed.

Meanwhile, the present invention has additional features in which, in addition to removing the microbubbles contained in the fluid with the porous thin film 200 while the sample passes through the microfluidic channel 110, in order to fundamentally block the inflow of microbubbles 200 into the main channel 160, as shown in FIG. 12, a pillar 142a is formed inside of the sample injection channel 142 so as to hold the microbubbles, and a bypass channel 144 is formed in front of the sample injection channel 142 on which the pillar 142a is formed to allow the sample to bypass the sample so as to introduce the sample into the main channel.

Herein, the bypass channel 144 is formed to connect the front and rear of the sample injection channel 142 on which the pillar 142a is formed, and thus the sample is directly introduced into the main channel 160 through the sample injection channel 142 or bypassed and introduced into the main channel 160 through the bypass channel 144.

Herein, it is preferable that a plurality of pillars 142a is formed in the width direction or the fluid flow direction of the sample injection channel 142. In other words, a predetermined gap is formed between the pillars 142a so that the sample can flow through the gap formed between the pillars 142*a*, but microbubbles cannot be passed through the gap to be caught by the pillars 142*a*.

That is, the pillar 142*a* is formed to hold microbubbles inside the sample injection channel 142 before the sample is introduced into the main channel 160. Thus, if there is no bubble, the sample smoothly flows into the main channel 160 through the sample injection channel 142, but when bubbles are formed, the sample is bypassed to the bypass channel 144 and may flow into the main channel 160.

At this time, the microbubbles caught by the pillar 142*a* come out downward through the porous thin film 200 to disappear over time. After the time passes and bubbles disappear, the sample may be smoothly introduced into the main channel 160 again.

In addition, a pillar 144*a* may be further installed at the point where the bypass channel 144 starts so as to prevent the microbubbles from entering the bypass channel 144. That is, when bubbles in the fluid are blocked by the pillar 142*a* of the sample injection channel, the bubbles may flow into the bypass channel 144 together with the sample. Thus, the pillar 144*a* is to be further installed at the point where the bypass channel 144 starts.

As such, the present invention may form a pillar in the sample injection channel 142 and the bypass channel 144 so as to block the inflow of the microbubbles into the main channel 160 and may completely remove the bubbles in the fluid by a structure in which the microbubble pass through the porous thin film 200 and come out to the lower panel 300.

Further, the bypass channel 144 may be formed as a curved portion of a predetermined curvature so as to guide the direction of the sample to the bypass channel 144. That is, as shown in FIG. 12, the bypass channel 144 may be formed of a curved portion having a predetermined curvature for the inflow of the sample and the smooth movement within the channel, and the inlet of the bypass channel 144 may also be formed as a curved portion of a predetermined curvature so as to allow the sample easily to be introduced into the bypass channel 144 when microbubbles are caught in the pillar 142*a*.

In addition, in one embodiment of the present invention, although one bypass channel 144 is formed in the sample injection channel 142, the present invention is not limited thereto, and one or more the bypass channels 144 can be formed in the sample injection channel 142. As such, when a plurality of bypass channels 144 are formed in the sample injection channel 142, the microbubbles may be more completely removed from the fluid even if the sample contains a lot of microbubbles.

Moreover, the bypass channel 144 may be formed in the main channel 160, the first discharge channel 172 or the second discharge channel 182 as well as the sample injection channel 142. In other words, if there are too many bubbles in the fluid, and the bypass channel 144 is formed only in the sample injection channel 140, there is a limit in removing bubbles. The bypass channel 144 may be formed in the main channel 160, first discharge channel 172, or the second discharge channel 182 to more completely remove bubbles in the fluid.

Meanwhile, although not shown in the figures, a pillar may be formed inside the buffer solution channel 152 so as to prevent the microbubbles included in the fluid from flowing into the main channel 160. Likewise, a bypass channel may also be formed in front of the buffer solution channel 152 to bypass the buffer solution and be introduced into the main channel 160.

Meanwhile, the microbubbles coming out downward through the porous thin film 200 is in contact with the surface of the lower panel 300.

The lower panel 300 is installed to be in contact with the bottom surfaces of the upper panel 100 and the porous thin film 200, and should be attached in a vacuum state to the microfluidic channel 110 to which the porous thin film 200 is attached and be provided with a path for discharging the microbubbles coming out through the porous thin film 200 to the outside.

In order to attach the microfluidic channel 110 and the lower panel 300 to which the porous thin film 200 is attached in a vacuum state, the present invention includes a vacuum-suctioning means for applying a vacuum.

Herein, the vacuum-suctioning means may include a vacuum groove 120 formed on a bottom surface of the upper panel 100 and a vacuum-suctioning hole 130 communicating with the vacuum groove 120 to apply a vacuum to the vacuum groove 120 so that the microfluidic channel 100, to which the porous thin film 200 is attached, is attached to the lower panel 300 in a vacuum state.

The vacuum groove 120 is formed to surround the periphery of the microfluidic channel 110 and the porous thin film 200. In other words, as shown in FIG. 9, the vacuum groove 120 is preferably formed in a quadrangular shape so as to include the region in which both the microfluidic channel 110 and the porous thin film 200 are formed.

Both ends of the vacuum-suctioning hole 130 are formed to communicate with the top or side surfaces of the upper panel 100 and the vacuum groove 120 and are connected to an external device, thereby applying a vacuum so as to completely remove the air layer between the lower panel 300 and the upper panel 100, resulting in the vacuum-suction between the lower panel 300 and the upper panel 100.

In the present invention, the vacuum-suctioning hole 130 is formed to communicate with the top surface of the upper panel 100 as shown in FIGS. 9 to 11, but the present invention is not limited thereto. The vacuum-suctioning hole 130 may have a structure in communication with the side surface of the upper panel 100 to suck the air in the vacuum groove 120 through the vacuum-suctioning hole 130 from the outside.

Due to this structure, the lower panel 300 and the channel 110 may be detachable by the vacuum groove 120. That is, when the vacuum is applied to the vacuum groove 120, the lower panel 300 and the channel 110 are attached by the vacuum, but when the vacuum which is applied to the vacuum groove 120 is released, the gap between the lower panel 300 and the channel 110 is generated, and the lower panel 300 and the channel 110 may be spaced.

Meanwhile, the microbubbles coming out through the porous thin film 200 are collected on the lower panel 300, and thus, the lower panel 300 should be provided with a path for discharging the microbubbles to the outside. To this end, in the present invention, the pattern 310 is protruded at regular intervals on the surface of the lower panel 300.

The pattern 310 is formed in the height of several micrometers on the surface of the lower panel 300 so as to generate a space of several micrometers between the porous thin film 200 and the lower panel 300. This space is a path through which the microbubbles passing through the porous thin film 200 may smoothly come out to the outside.

The pattern 310 may be formed integrally on a surface of the lower panel 300 or by attaching a patterned thin film thereon.

The known technique may be applied to the method of integrally forming the patterns 310 on the surface of the lower panel 300, and thus a detailed description thereof will be omitted.

Figure 13:
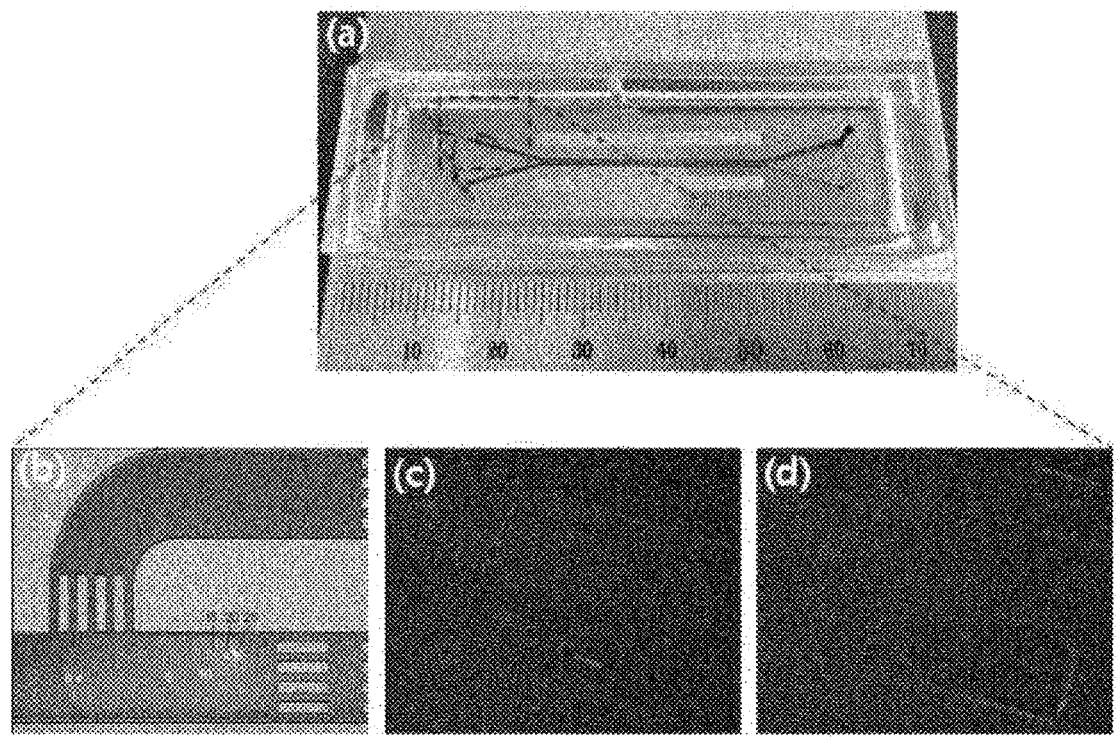
FIG. 13 is a photograph showing an actual sample of a sample injection device of the present invention.

FIG. 13 is a photograph showing an actual sample of a sample injection device of the present invention. The sample is injected into the sample inlet formed at the upper left, and the buffer solution is injected into the buffer solution inlet formed at the lower left in the microfluidic channel.

Samples include the blood, cells or particles to be separated, and microbubbles. Before entering the main channel, there are pillars inside the channel that make a two-way path so as to catch the incoming microbubbles (See (b) of FIG. 13).

Figure 14:
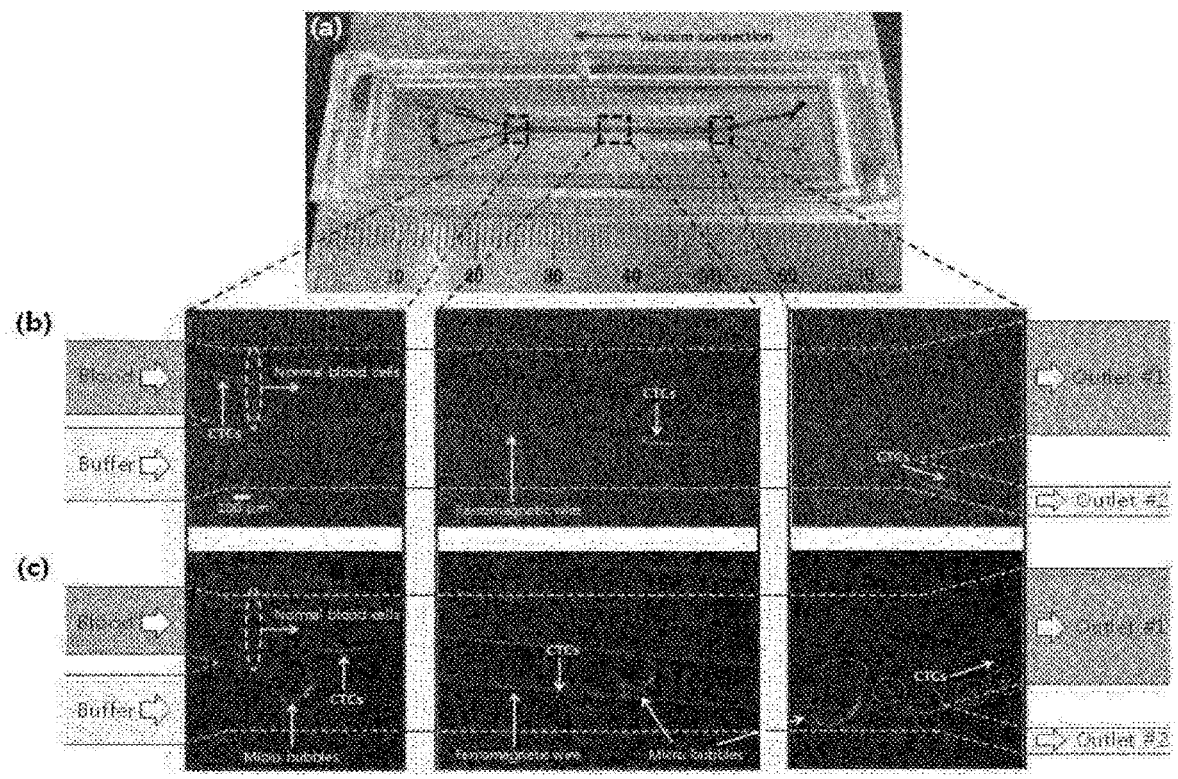
FIG. 14 is a photograph showing the separation of cells using the actual sample shown in FIG. 5.

FIG. 14 is a photograph showing the separation of cells using the actual sample shown in FIG. 13. (b) of FIG. 14 shows the separation of cells by a device with a porous thin film attached thereto, and (c) of FIG. 14 shows the separation of cells by a device without a porous thin film attached thereto.

Referring to this, when the porous thin film is attached, and the cells are separated while the vacuum is applied, the cells are smoothly separated without microbubbles and come out through the desired cell outlet #2 (See (b) of FIG. 14).

On the other hand, when the device, to which the porous thin film is not attached, is used, bubbles are formed inside the channel, and cells cannot be separated normally and come out through outlet #1 (See (c) of FIG. 14).

Figure 15:
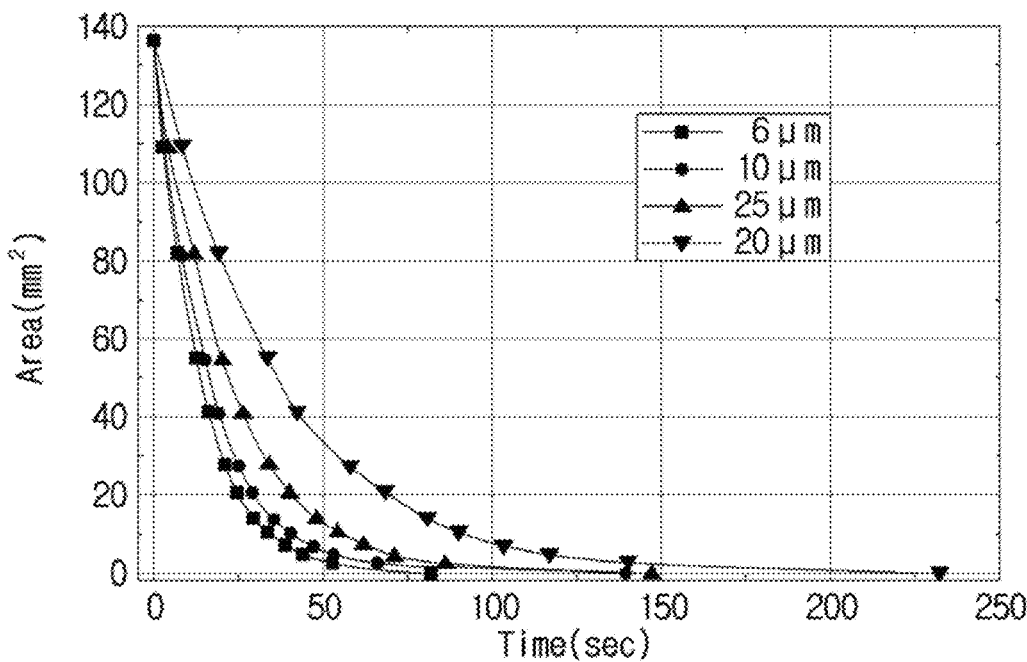
FIG. 15 is a graph showing the rate at which microbubbles disappear according to the thickness of the porous thin film in the present invention.

Further, FIG. 15 is a graph showing the rate at which microbubbles disappear according to the thickness of the porous thin film in the present invention. The X-axis represents the time when it takes for the bubble to disappear when the fluid proceeds into the channel, and the Y-axis represents the volume of air remaining inside the channel as the fluid proceeds into the channel.

In FIG. 15, the thickness of the porous thin film under the microfluidic channel was differently applied to 6, 10, 15, and 20 μm, respectively, to measure how quickly the fluid fills the inside of the channel.

As a result, it was confirmed that the thinner the thin film, the faster the fluid fills the inside of the microfluidic channel.

Therefore, in order to quickly remove the microbubbles in the fluid, it is preferable to reduce the thickness of the porous thin film. Further, the rate at which the microbubbles in the fluid come out can be adjusted according to the thickness of the porous thin film, the height of the pattern of the lower panel, the strength of the vacuum applied to the vacuum groove and the size of the hole formed in the porous thin film.

Figure 16:
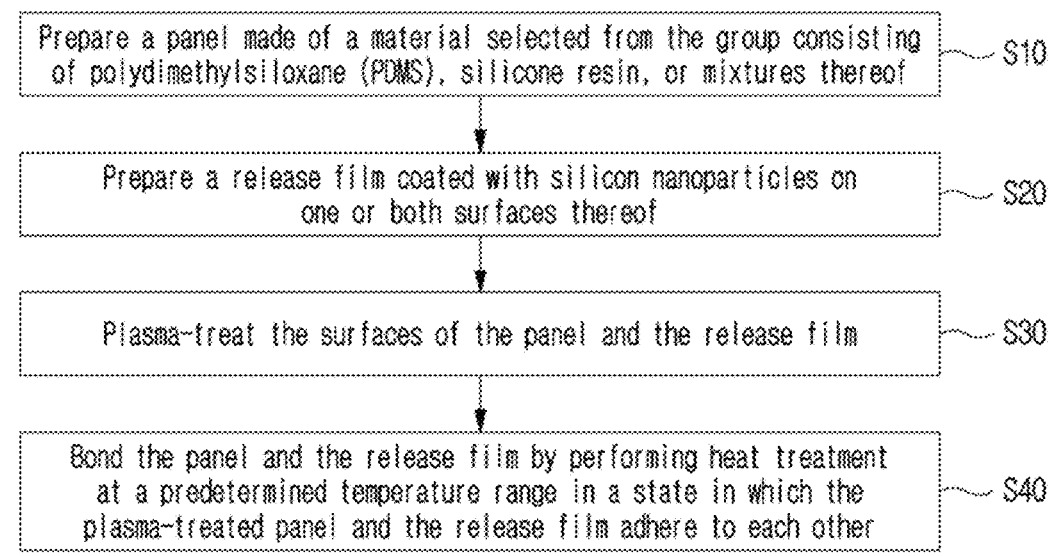
FIG. 16 is a flowchart illustrating an embodiment of a method of bonding panels of a microfluidic element using a release film of the present invention.
Figure 17:
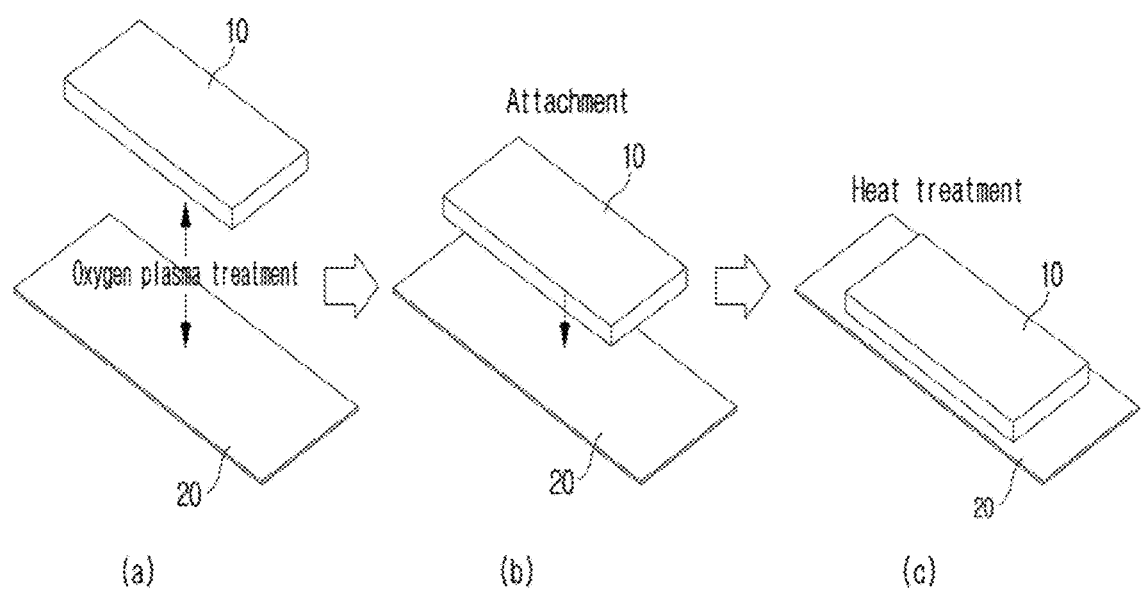
FIG. 17 is a flowchart showing a method of bonding panels of a microfluidic element using a release film of the present invention.
Figure 18:
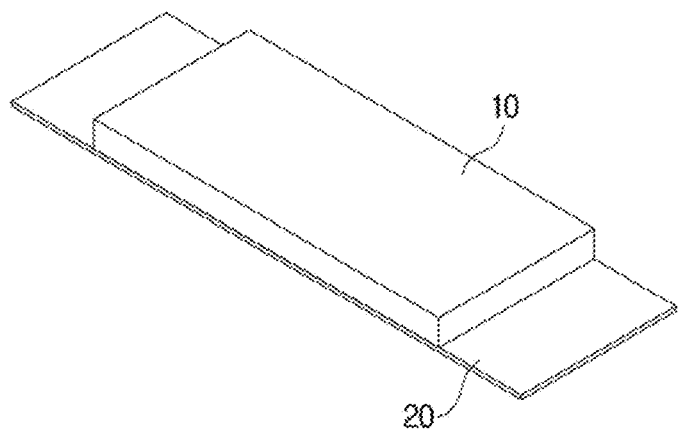
FIGS. 18 to 19 are perspective views illustrating embodiments in which a panel and a release film are bonded in the present invention.
Figure 19:
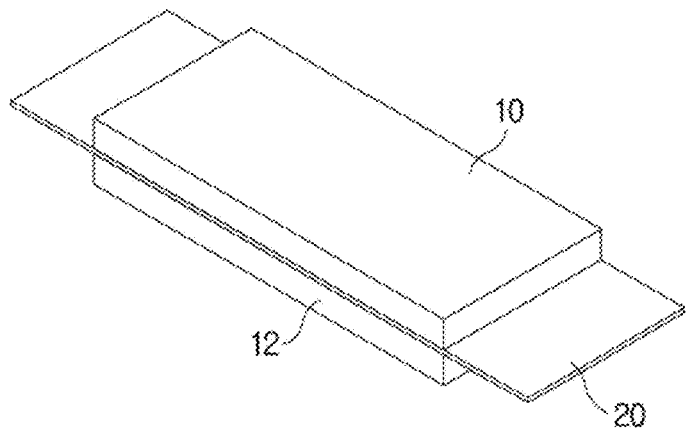

FIG. 16 is a flowchart illustrating an embodiment of a method of bonding panels of a microfluidic element using a release film of the present invention. FIG. 17 is a flowchart showing a method of bonding panels of a microfluidic element using a release film of the present invention. FIGS. 18 to 19 are perspective views illustrating embodiments in which a panel and a release film are bonded in the present invention.

The present invention is a method of bonding panel of the microfluidic element using a release film in which the method is capable of attaching the release film and panel by a simple process without solvent in the process of manufacturing microfluidic technology-based devices for sensors, separation, measurement, cell culturing, and analysis, thereby providing the strongest adhesion. As shown in FIG. 16, the method includes S10 of preparing a panel, S20 of preparing a release film coated with silicon nanoparticles on one or both surfaces thereof. S30 of plasma-treating the surfaces of the panel and the release film, and S40 of bonding the panel and the release film by performing heat treatment at a predetermined temperature range in a state in which the plasma-treated panel and the release film are attached to each other.

Here, the panel 10 is made of a material selected from the group consisting of silicon polydimethylsiloxane (PDMS), a silicone resin or a mixture thereof.

In other words, the present invention provides a method of strongly bonding the panel 10 made of silicone-based resin with the release film 20, and it is most preferable to use polydimethylsiloxane (PDMS) among the silicone-based resin. PDMS is a well-known silicone rubber material that can be purchased at a relatively low cost and can form microfluidic channels.

Further, the material of the release film 20 includes a film including at least one selected from the group consisting of polyethylene terephthalate (PET), polyimide (PI), polycarbonate (PC), polypropylene (PP), poly(methyl methacrylate) (PMMA), polycaprolactone, polystyrene, propylene carbonate, ethylene carbonate, dimethyl carbonate, diethyl carbonate, and polymer plastic.

That is, if the release film 20 is made of a polymer material such as PET, PI, PC, PP, etc. and is provided with silicon nanoparticles coated on one side or both sides thereof, various kinds of all release films widely used can be applied to the present invention.

Further, the thickness of the release film 20 can be applied in various ways. Usually, the thickness of the release film 20 is mainly used in the range of about 10 μm to about 100 μm. The release film can also be used in the present invention as long as it satisfies the above-described thickness range. The release film may be used as long as it satisfies the condition that the silicon nanoparticles are applied to one or both surfaces thereof.

As shown in FIG. 17, the panel 10 and the release film 20 of such a material are first subjected to a plasma treatment. See (a) of FIG. 17.

In this case, plasma treatment is performed on the surfaces of the panel 10 and the release film 20 to be bonded.

The plasma may include one single gas or one or more mixed gas of oxygen ($O_2$), hydrogen ($H_2$), argon (Ar), nitrogen ($N_2$), helium (He), hydrogen/argon ($H_2$/Ar), nitrogen/argon ($N_2$/Ar), oxygen/argon ($O_2$/Ar), helium/argon (He/Ar), tetrafluoromethane ($CF_4$), methane ($CH_4$), ethane ($C_2H_6$), tetrafluoromethane/argon ($CF_4$/Ar), methane/argon ($CH_4$/Ar), methane/hydrogen ($CH_4$/$H_2$), and ethane/hydrogen ($C_2H_6$/$H_2$).

In general, the plasma treatment uses oxygen, but the present invention is not limited thereto, and processing conditions according to the plasma treatment such as supply power, gas usage, and plasma treatment time may be variously applied.

As a result of the experiment which the applicant of the present invention has conducted, 6.8 W RF power is more preferable for power, and 60 seconds to 120 seconds is appropriate for the plasma treatment time. It is shown that such a condition provides the strongest adhesion. However, the present invention is not necessarily limited thereto. It is apparent that the above conditions can be changed according to the experimental condition and the working environment.

As described above, for the plasma-treated panel 10 and the release film 20, one surface of the plasma-treated panel 10 is bonded to the release film 20 as shown in (b) of FIG. 17.

Thereafter, when the panel 10 and the release film 20 are heat-treated in a predetermined temperature range, the panel 10 and the release film 20 are bonded with strong adhesion (See (c) of FIG. 17).

Here, the heat treatment is preferably performed for 30 minutes to 1 hour 30 minutes in the range of 65° C. to 110° C.

The temperature range and the processing time of the heat treatment will be described below, but these ranges are represented as a numerical value provided by the process conditions showing the strongest adhesion obtained by the present applicant's experimental. It is confirmed that the adhesive force of the panel 10 and the release film 20 is increased as the temperature of the heat treatment is gradually increased from room temperature, and the adhesive force shows a constant value from 65° C. or higher.

In other words, even when the panel 10 and the release film 20 are bonded to each other even at room temperature, the panel 10 and the release film 20 adhere, but in this case, the adhesive force is low and unreliable level. In order to give the strongest adhesion, the temperature of the heat treatment should be 65° C. or higher.

Further, since the release film 20 has a melting point (119° C.), it is impossible to measure at a temperature of 119° C. or more, and when the heat treatment temperature exceeds 110° C., the release film 20 approaches the melting point temperature thereof, which may adversely affect the quality of the release film 20. Thus, 65° C. to 110° C. is the most suitable for the temperature range for heat treatment after bonding the plasma-treated panel 10 and the release film 20, and 30 minutes to 1 hour 30 minutes is preferable for the processing time.

As a result of the present applicant's experiment, the most preferable process time according to the heat treatment was found to be about 1 hour, and when the heat treatment was performed for 1 hour, the adhesion between the panel 10 and the release film 20 was the strongest. Therefore, the time of heat treatment after bonding the plasma-treated panel 10 and the release film 20 is preferably at least 30 minutes or more and at most about 1 hour and 30 minutes.

If the heat treatment time is less than 30 minutes, the adhesion force between the panel 10 and the release film 20 is unreliable, and if it exceeds 1 hour 30 minutes, the processing time for manufacturing the microfluidic device is not efficient because it takes a long time without any difference in adhesion force.

As described above, for the bonding between the panel 10 and the release film 20, when the silicon nanoparticles are applied to both surfaces of the release film 20, as shown in FIG. 19, the panel 10 and 12, respectively, can be attached on both sides of the release film 20.

As described above, the method of bonding panel of the microfluidic device using the release film of the present invention is performed by a strong bonding process achieved through the simple plasma treatment and heat treatment of the plastic release film 20 and PDMS panel 10 without chemical surface treatment process so that the process is very simple and provides strong adhesion, thereby allowing the method to be applied to various processes in manufacturing microfluidic technology-based devices for sensors, separation, measurement, cell culturing, and analysis.

In other words, when the panel bonding method of the present invention is applied to a panel having a pattern for a microfluidic channel formed on one surface, microfluidic elements of various forms can be manufactured.

Figure 20:
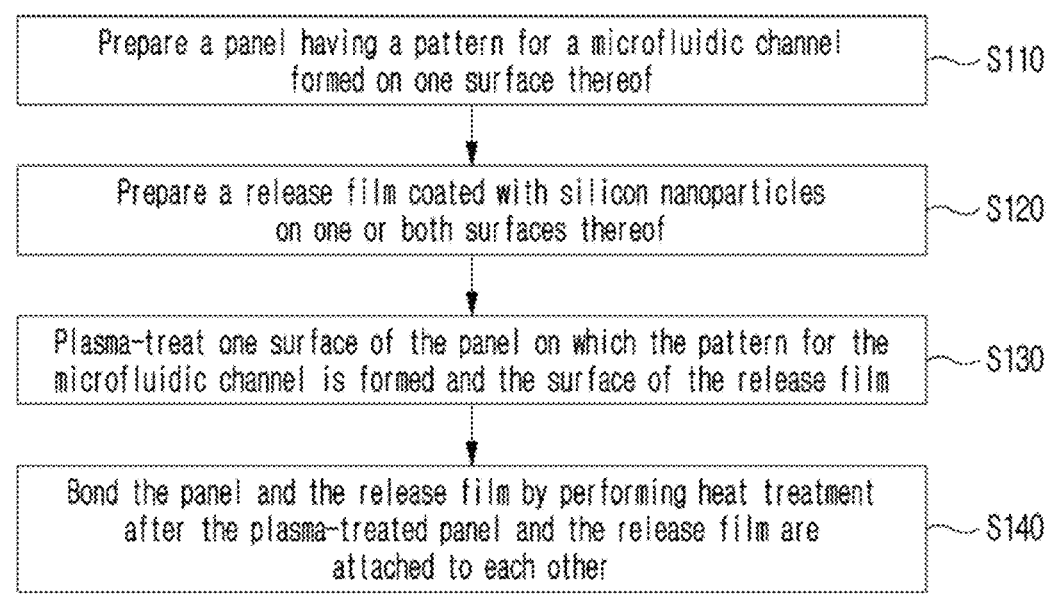
FIG. 20 is a flowchart illustrating another embodiment of a method of bonding panels of a microfluidic element using a release film of the present invention.
Figure 21:
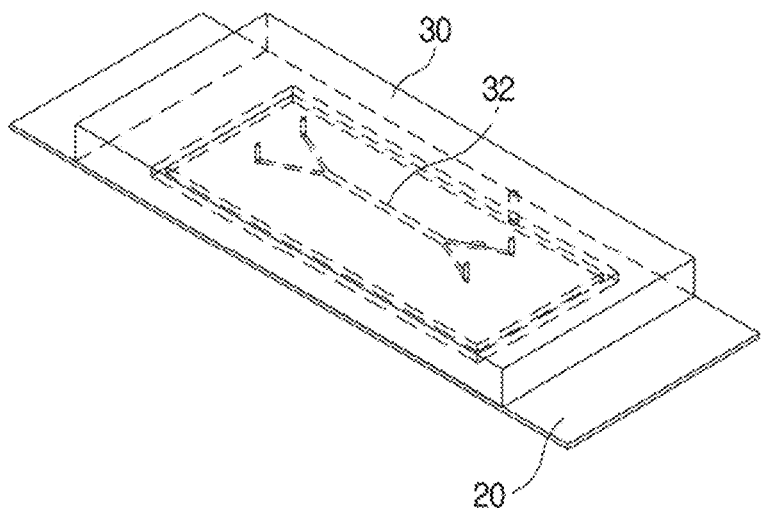
FIG. 21 is a perspective view illustrating an embodiment in which a panel and a release film are bonded in the present invention.
Figure 22:
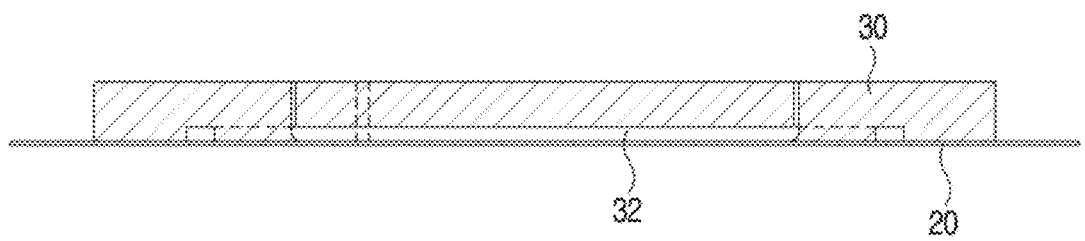
FIG. 22 is a cross-sectional view of FIG. 21.

FIG. 20 is a flowchart illustrating another embodiment of a method of bonding panels of a microfluidic element using a release film of the present invention. FIG. 21 is a perspective view illustrating an embodiment in which a panel and a release film are bonded in the present invention. FIG. 22 is a cross-sectional view of FIG. 21.

As shown in FIGS., the present invention includes S110 of preparing a panel 30 having a pattern for a microfluidic channel 32 formed on one surface thereof, S120 of preparing a release film 20 coated with silicon nanoparticles on one or both surfaces thereof, S130 of plasma-treating one surface of the panel 30 on which the pattern for the microfluidic channel 32 is formed and the surface of the release film 20 and S140 of bonding the panel and the release film by performing heat treatment at a predetermined temperature range in a state in which the plasma-treated panel and the release film are attached to each other.

In this case, the pattern for microfluidic channel 32 may be formed in a groove shape on one surface of the panel 30. In other words, when the release film 20 is attached to one surface of the panel 30 on which the pattern 32 is formed intaglio by applying plasma treatment and heat treatment step by step, the release film 20 is attached to the pattern for microfluidic channel 32 to form the microfluidic channel.

Therefore, the micro-channels can be manufactured in a very simple process without a complicated process such as a conventional soft lithography process or solvent bonding method of forming a microfluidic channel on a polymer substrate.

In this case, the release film 20 may be formed of a porous thin film for removing microbubbles contained in the fluid passing through the microfluidic channel.

The porous thin film is a thin film having a nano-sized hole so that only the microbubbles contained in the fluid pass through the film and come out downward without passing the fluid flowing through the microfluidic channel. By attaching the porous thin film to the bottom surface of the microfluidic channel, the microbubbles in the fluid flowing through the microfluidic channel pass through the porous thin film and come out downward so as to remove the microbubbles present in the sample and the buffer solution.

When the release film 20 is made of a porous thin film, the release film 20 may be made of a hydrophobic material that is not intimate with water or may be coated with a hydrophobic material to prevent the fluid flowing through the microfluidic channel from passing through the microfluidic channel.

The adhesion test between the release film and the release film attached through the bonding method of the release film and the panel of the present invention configured as described above was performed.

Figure 23:
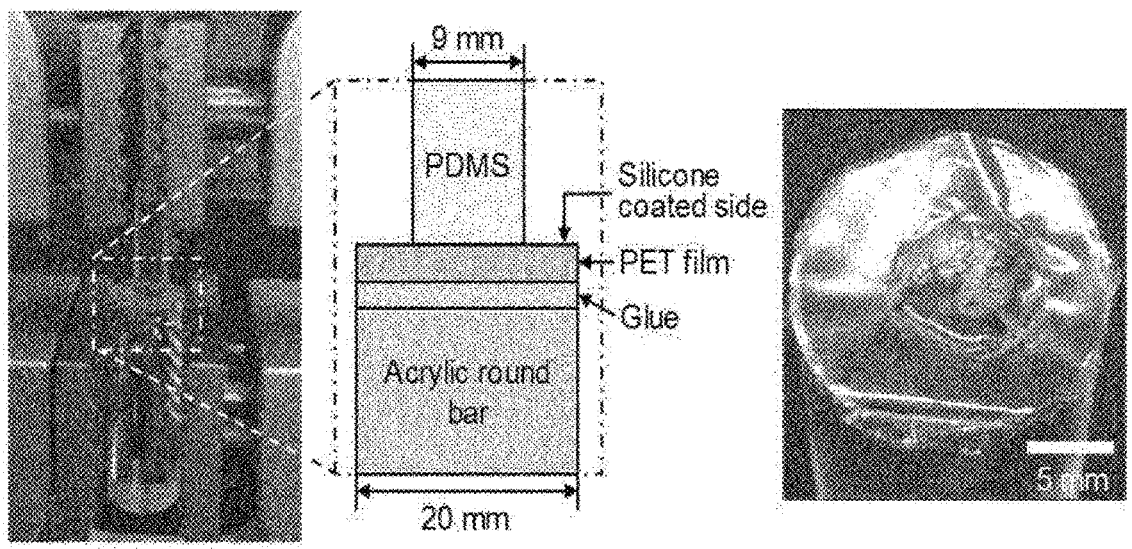
FIG. 23 is a photograph of showing the bonding test performed in the present invention.
Figure 24:
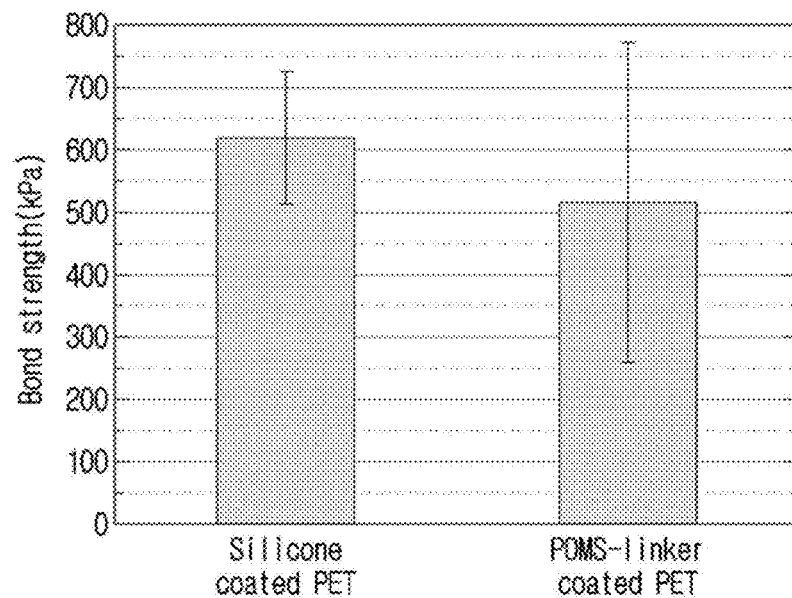
FIG. 24 is a graph showing the adhesion of the release film as a result of the bonding test in FIG. 23.

FIG. 23 is a photograph of showing the bonding test performed in the present invention. FIG. 24 is a graph showing the adhesion of the release film as a result of the bonding test in FIG. 23.

Referring to FIG. 23, a release film (PET material) was attached to a bar of acrylic material using glue, and another surface of the release film was coated with silicon nanoparticles so that the release film was bonded to the PDMS panel by the bonding method of the present invention.

As shown in the graph of FIG. 24, the adhesion between the release film and the PDMS panel attached by the bonding method of the present invention was found to be 617 kPa. On the other hand, the adhesion of the PDMS linker coated PET was only 514 kPa. These results indicate that the adhesion is excellent when the release film and the PDMS panel are bonded by the panel bonding method of the present invention.

Figure 25:
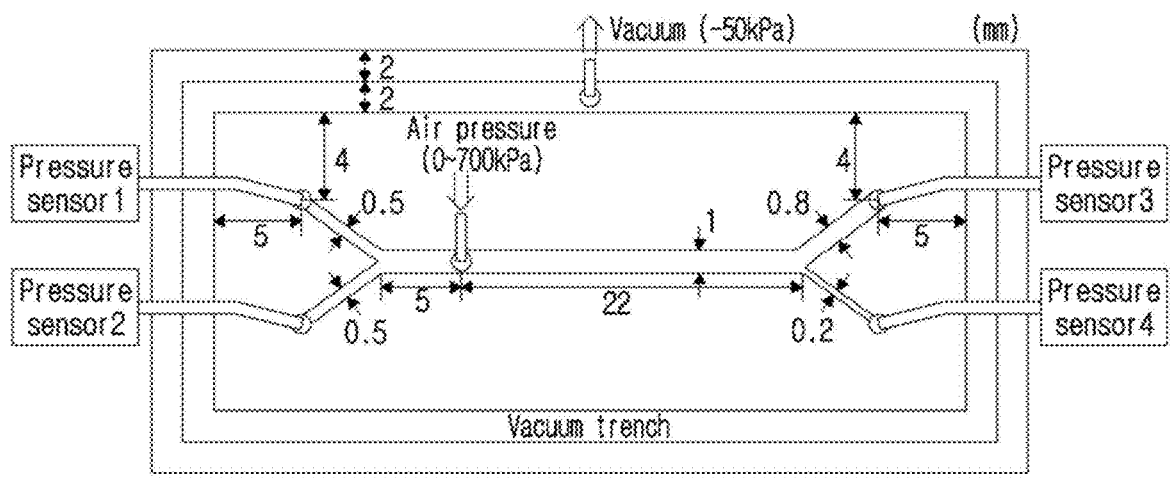
FIG. 25 is a plan view showing a panel in which microfluidic channels bonded by the method of the present invention is formed in order to test the stability of the present invention.
Figure 26:
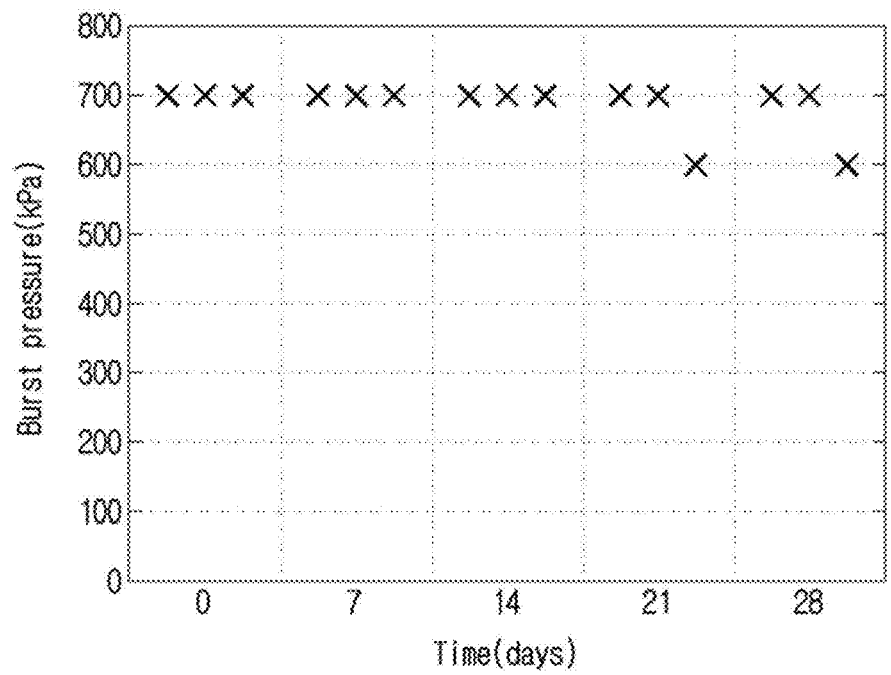
FIG. 26 is a graph showing the measurement result of FIG. 25.
Figure 27:
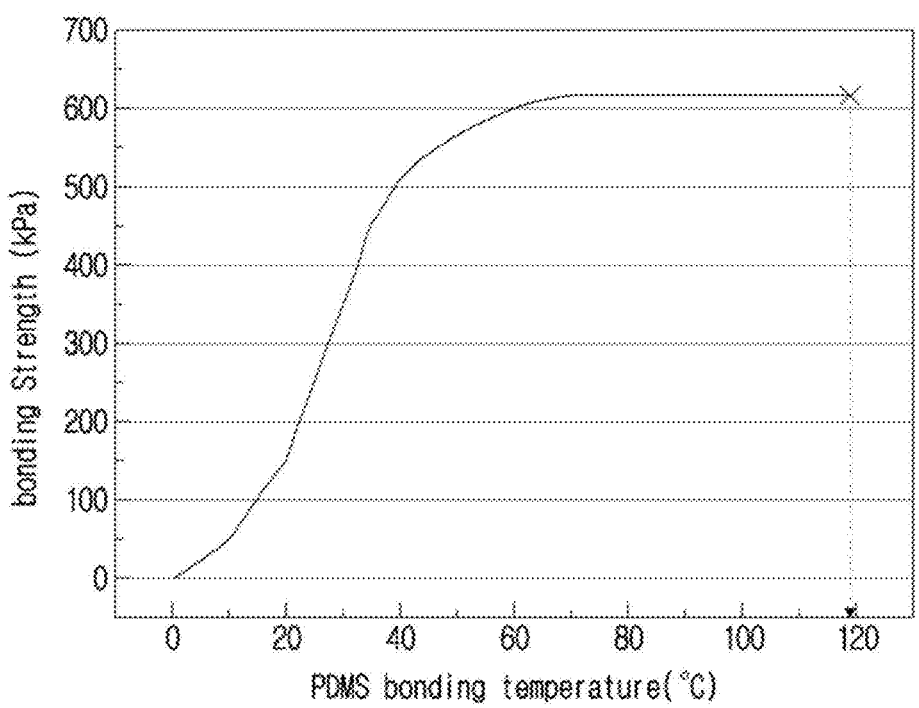
FIG. 27 is a graph showing the results of testing the adhesion of the panel and the release film for each temperature.

FIG. 25 is a plan view showing a panel in which microfluidic channels bonded by the method of the present invention is formed in order to test the stability of the present invention. FIG. 26 is a graph showing the measurement result of FIG. 25. FIG. 27 is a graph showing the results of testing the adhesion of the panel and the release film for each temperature.

Referring to FIG. 25, air pressure was injected up to 700 kPa in the middle of the microfluidic channel, and a pressure sensor was connected to each inlet to measure a pressure value at which air pressure was injected into the microfluidic channel.

In order to measure the adhesion between the release film and the PDMS panel, after manufacturing the biochip with the release film attached to the PDMS panel, the pressure value was immediately measured by a pressure sensor. Then, it had been immersed in water for 7 days to 28 days and then the pressure value was measured in the same manner.

As shown in FIG. 26, it was confirmed that even after immersing for a long time, the biochip having a configuration in which the PDMS panel and the release film are attached has the same stability.

In addition, as a result of the adhesion test of the PDMS panel and the release film for each temperature, as shown in FIG. 27, it has been found that the adhesion of the PDMS panel and the release film is gradually increased as the temperature increases, but it has a constant value of 617 kPa from 65° C. or more (based on 1 hour of the heat treatment).

Further, since the melting point of the release film cannot be measured above 119° C., as described above, the temperature range for heat treatment after bonding the plasma-treated panel 10 and the release film 20 is 65° C. to 110° C., which is most appropriate range.

It is apparent that the scope of rights of the present invention is not limited to the embodiments described above, but is defined by the claims, and those skilled in the art can make various modifications and adaptations within the scope of the claims.

The invention claimed is:

1. A sample injection device for preventing inflow of bubbles, the device comprising:
   a sample inlet into which a sample is injected;
   an upper panel formed with a microfluidic channel including a sample injection channel connecting a main channel to the sample inlet;
   a bubble inflow-preventing means formed in a portion of the microfluidic channel to be capable of holding bubbles included in the fluid;
   a porous thin film attached to a bottom surface of the microfluidic channel to remove bubbles included in the fluid passing through the microfluidic channel;
   a lower panel contacting the upper panel and a bottom surface of the porous thin film and having a path for discharging bubbles, which pass through the porous thin film, to the outside; and
   a vacuum-suctioning means for vacuum-suctioning the upper panel and the lower panel such that the microfluidic channel, to which the porous thin film is attached, is attached to the lower panel in a vacuum state, wherein the vacuum-suctioning means comprises a vacuum groove formed on a bottom surface of the upper panel, and a vacuum-suctioning hole communicating with the vacuum groove to apply a vacuum to the vacuum groove so that the microfluidic channel, to which the porous thin film is attached, is attached to the lower panel in a vacuum state,
   wherein the bubble inflow-preventing means includes a pillar in the sample injection channel to hold bubbles so as to prevent the bubbles contained in the sample from entering into the main channel, and a bypass channel in front of the pillar in the sample injection channel to bypass the sample so as to introduce the sample into the main channel, and
   wherein the bypass channel is located closer to the sample inlet than the pillar in the sample injection channel.

2. The sample injection device of claim 1, wherein the bypass channel is formed to connect the front and the rear of the pillar-formed sample injection channel.

3. The sample injection device of claim 1, wherein a plurality of pillars is formed in the width direction or the fluid flow direction of the sample injection channel, and
   wherein the sample can flow in the gap between the pillars while bubbles are caught by the pillars.

4. The sample injection device of claim 1, wherein the pillar is installed at a point at which the bypass channel starts to prevent bubbles from introducing into the bypass channel.

5. The sample injection device of claim 1, wherein the bypass channel is formed of a curved portion so as to induce the direction of the sample to the bypass channel.

6. The sample injection device of claim 1, wherein a plurality of the bypass channels are formed in parallel in the sample injection channel.

7. The sample injection device of claim 1, wherein the microfluidic channel further includes a buffer solution inlet for the injecting a buffer solution and a buffer solution channel connecting the main channel to the buffer solution inlet,
   wherein a second pillar is additionally formed in the buffer solution channel, and
   wherein a bypass channel is formed in front of the second pillar in the buffer solution channel so as to allow that the buffer solution is bypassed to be introduced into the main channel.

8. The sample injection device of claim 1, wherein a pattern protrudes from the surface of the lower panel so that a path for discharging the bubbles coming out through the porous thin film to the outside is provided.

9. The sample injection device of claim 8, wherein the pattern is formed integrally on a surface of the lower panel or by attaching a patterned thin film thereon.

10. The sample injection device of claim 1, wherein the porous thin film has hydrophobicity so as to block the fluid flowing through the microfluidic channel to pass through the microfluidic channel, but so as to allow only the microbubbles included in the fluid to pass through the microfluidic channel to the lower panel.

11. The sample injection device of claim 10, wherein the porous thin film is made of a hydrophobic material or has hydrophobicity on a surface of the porous thin film by treatment of a hydrophobic material.

12. The sample injection device of claim 11, wherein the material of the porous thin film includes at least one selected from the group consisting of polydimethylsiloxane (PDMS), polyethylene terephthalate (PET), polyimide (PI), polypropylene (PP), poly(methyl methacrylate) (PMMA), polycaprolactone, polystyrene, propylene carbonate, ethylene carbonate, dimethyl carbonate, diethyl carbonate, polymer plastic, glass, paper and ceramic.

13. The sample injection device of claim 1, wherein the vacuum groove is formed to surround the periphery of the microfluidic channel and the porous thin film, and wherein the vacuum-suctioning hole is formed to communicate with a top surface or a side surface of the upper panel.

\* \* \* \* \*